United States Patent
Seo et al.

(10) Patent No.: US 12,543,459 B2
(45) Date of Patent: Feb. 3, 2026

(54) DISPLAY PANEL AND DISPLAY APPARATUS INCLUDING THE SAME

(71) Applicant: Samsung Display Co., Ltd., Yongin-Si (KR)

(72) Inventors: Youngwan Seo, Yongin-si (KR); Jisun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 456 days.

(21) Appl. No.: 18/094,832

(22) Filed: Jan. 9, 2023

(65) Prior Publication Data

US 2023/0225164 A1 Jul. 13, 2023

(30) Foreign Application Priority Data

Jan. 10, 2022 (KR) ................... 10-2022-0003617

(51) Int. Cl.
*H10K 59/131* (2023.01)
*H10D 86/40* (2025.01)
*H10D 86/60* (2025.01)
*H10K 59/121* (2023.01)
*H10K 59/35* (2023.01)

(52) U.S. Cl.
CPC ......... *H10K 59/131* (2023.02); *H10D 86/441* (2025.01); *H10D 86/60* (2025.01); *H10K 59/1213* (2023.02); *H10K 59/35* (2023.02)

(58) Field of Classification Search
CPC ................. H10K 59/12; H10K 59/121; H10K 2102/311; H10K 77/111
See application file for complete search history.

(56) References Cited

U.S. PATENT DOCUMENTS

| 9,134,773 | B2 | 9/2015 | Hall |
| 2017/0337878 | A1* | 11/2017 | Kim ................... H10D 86/40 |
| 2020/0142449 | A1* | 5/2020 | Nakatogawa .......... H05B 33/02 |
| 2020/0203382 | A1* | 6/2020 | Jung ................... G09G 3/3266 |
| 2021/0376038 | A1 | 12/2021 | Won et al. |
| 2022/0077271 | A1 | 3/2022 | Lee et al. |
| 2022/0102461 | A1 | 3/2022 | Zhou et al. |

(Continued)

FOREIGN PATENT DOCUMENTS

| CN | 111063719 A | 4/2020 |
| CN | 112133733 A | 12/2020 |

(Continued)

*Primary Examiner* — Yuzhen Shen
(74) *Attorney, Agent, or Firm* — Innovation Counsel LLP

(57) ABSTRACT

A display panel includes main pixels, a third scan line, first corner pixels, a first scan line, second corner pixels, and a second scan line. The main pixels include a main pixel. The third scan line is electrically connected to the main pixel and extends lengthwise in a third direction. The first corner pixels are arranged at a corner of the display panel and include a first corner pixel. The first scan line is electrically connected to the first corner pixel and extends lengthwise in a second direction. The second corner pixels are arranged between the first corner pixels and the main pixels and include a second corner pixel. The second scan line is electrically connected to the second corner pixel and extends lengthwise in a first direction. The first direction, the second direction, and the third direction are different from each other.

20 Claims, 15 Drawing Sheets

(56) References Cited

U.S. PATENT DOCUMENTS

2022/0102462 A1\* 3/2022 Zhou .................. H10K 59/1201
2022/0173169 A1\* 6/2022 Cai ........................ H04N 23/45
2022/0320189 A1   10/2022 Lee et al.

FOREIGN PATENT DOCUMENTS

| KR | 10-2020-0005367 A | 1/2020 |
| KR | 10-2021-0149279 A | 12/2021 |
| KR | 10-2022-0033574 A | 3/2022 |
| KR | 10-2022-0138498 A | 10/2022 |

\* cited by examiner

DISPLAY PANEL AND DISPLAY APPARATUS INCLUDING THE SAME

CROSS-REFERENCE TO RELATED APPLICATION

This application claims priority 35 U.S.C. § 119 to Korean Patent Application No. 10-2022-0003617 filed on Jan. 10, 2022 in the Korean Intellectual Property Office; the Korean Patent Application is incorporated by reference.

BACKGROUND

1. Field

The technical field is related to a display panel and a display apparatus including the display panel.

2. Description of the Related Art

A display apparatus may include a display panel for displaying images in response to input signals. The display panel may include a display area and a non-display area. The display area may include light-emitting elements and/or light controlling elements for emitting and/or transmitting light to display images. The non-display area may accommodate electronic components and may not display images in response to input signals. Given the limited size of the display panel, it is generally desirable to maximize the display area and to minimize the non-display area.

SUMMARY

One or more embodiments may be related to a display panel that may display one or more images in one or more corner display areas of the display panel. One or more embodiments may be related to a display apparatus that includes the display panel.

According to one or more embodiments, a display panel includes a substrate including a main display area, a first corner display area, and a second corner display area, the first corner display area extending from a corner of the main display area and including a strip between cuts, and the second corner display area being between the main display area and the first corner display area, first corner pixels arranged in the first corner display area, first corner pixel circuits configured to drive the first corner pixels, second corner pixels arranged in the second corner display area, second corner pixel circuits configured to drive the second corner pixels, and a corner driving circuit between the first corner pixel circuits and the second corner pixel circuits, the corner driving circuit being configured to provide a scan signal, wherein long sides of the first corner pixel circuits are arranged parallel to a first direction that is a longitudinal direction of the strip, and long sides of the second corner pixel circuits are arranged parallel to a second direction crossing the first direction.

A connection relationship between the first corner pixels and the first corner pixel circuits may be different from a connection relationship between the second corner pixels and the second corner pixel circuits.

The first corner pixels and the first corner pixel circuits may be provided in a matrix form in which the first direction is used as a column direction and the second direction is used as a row direction, and first corner pixels arranged in a same row may be all connected to first corner pixel circuits arranged in a same row.

The second corner pixels and the second corner pixel circuits may be provided in a matrix form in which the first direction is used as a column direction and the second direction is used as a row direction, and some of second corner pixels arranged in a same column may be connected to second corner pixel circuits arranged in different columns.

Each of the first corner pixels may include a red subpixel, a green subpixel, and a blue subpixel, and a red subpixel, a green subpixel, and a blue subpixel included in one of the first corner pixels may be connected to the first corner pixel circuits arranged in the second direction.

Each of the second corner pixels may include a red subpixel, a green subpixel, and a blue subpixel, and a red subpixel, a green subpixel, and a blue subpixel included in one of the second corner pixels may be connected to the second corner pixel circuits arranged in the first direction.

A scan line included in each of the first corner pixel circuits may extend in the second direction, and a scan line included in each of the second corner pixel circuits may extend in the first direction.

At least some of the first corner pixels or the second corner pixels may overlap the corner driving circuit.

The first corner pixels and the second corner pixels may be respectively arranged in three columns in the second direction.

Each of the first corner pixels may include a red subpixel, a green subpixel, and a blue subpixel, and one side of the blue subpixel may be arranged to correspond to one side of the red subpixel and one side of the green subpixel.

According to one or more embodiments, a display apparatus includes a display panel including a main display area and a corner display area, the corner display area extending from a corner of the main display area and being bent with a preset radius of curvature, and a cover window having a shape corresponding to a shape of the display panel, the cover window covering the display panel, wherein the corner display area includes a first corner display area and a second corner display area, the first corner display area including a strip between cuts, and the second corner display area being between the main display area and the first corner display area, first corner pixels and first corner pixel circuits are arranged in the first corner display area, the first corner pixel circuits being configured to drive the first corner pixels, second corner pixels and second corner pixel circuits are arranged in the second corner display area, the second corner pixel circuits being configured to drive the second corner pixels, a corner driving circuit is between the first corner pixel circuits and the second corner pixel circuits, the corner driving circuit being configured to provide a scan signal, long sides of the first corner pixel circuits are arranged parallel to a first direction that is a longitudinal direction of the strip, and long sides of the second corner pixel circuits are arranged parallel to a second direction crossing the first direction.

A connection relationship between the first corner pixels and the first corner pixel circuits may be different from a connection relationship between the second corner pixels and the second corner pixel circuits.

The first corner pixels and the first corner pixel circuits may be provided in a matrix form in which the first direction is used as a column direction and the second direction is used as a row direction, and first corner pixels arranged in a same row may be all connected to first corner pixel circuits arranged in a same row.

The second corner pixels and the second corner pixel circuits may be provided in a matrix form in which the first direction is used as a column direction and the second direction is used as a row direction, and some of second corner pixels arranged in a same column may be connected to second corner pixel circuits arranged in different columns.

Each of the first corner pixels may include a red subpixel, a green subpixel, and a blue subpixel, and a red subpixel, a green subpixel, and a blue subpixel included in one of the first corner pixels may be connected to the first corner pixel circuits arranged in the second direction.

Each of the second corner pixels may include a red subpixel, a green subpixel, and a blue subpixel, and a red subpixel, a green subpixel, and a blue subpixel included in one of the second corner pixels may be connected to the second corner pixel circuits arranged in the first direction.

A scan line included in each of the first corner pixel circuits may extend in the second direction, and a scan line included in each of the second corner pixel circuits may extend in the first direction.

At least some of the first corner pixels or the second corner pixels may overlap the corner driving circuit.

The first corner pixels and the second corner pixels may be respectively arranged in three columns in the second direction.

Each of the first corner pixels may include a red subpixel, a green subpixel, and a blue subpixel, and one side of the blue subpixel may be arranged to correspond to one side of the red subpixel and one side of the green subpixel.

An embodiment may be related to a display panel. The display panel may include main pixels, a third scan line, first corner pixels, a first scan line, second corner pixels, and a second scan line. The main pixels may include a main pixel. The third scan line may be electrically connected to the main pixel and may extend lengthwise in a third direction. The first corner pixels may be arranged at a corner of the display panel and may include a first corner pixel. The first scan line may be electrically connected to the first corner pixel and may extend lengthwise in a second direction. The second corner pixels may be arranged between the first corner pixels and the main pixels and may include a second corner pixel. The second scan line may be electrically connected to the second corner pixel and may extend lengthwise in a first direction. The first direction, the second direction, and the third direction may be different from each other.

The first corner pixel may include a first switching transistor. The first switching transistor may include a first source electrode, a first drain electrode, and a first gate electrode. The first gate electrode may be positioned between the first source electrode and the first drain electrode in the first direction and may be electrically connected to the first scan line. The second corner pixel may include a second switching transistor. The second switching transistor may include a second source electrode, a second drain electrode, and a second gate electrode. The second gate electrode may be positioned between the second source electrode and the second drain electrode in the second direction and may be electrically connected to the second scan line.

The first corner pixels may include first light-emitting element sets and first corner pixel circuits. Light-emitting elements of some of the first light-emitting element sets that are aligned in the second direction may be all electrically connected to some of the first corner pixel circuits that are arranged (and aligned) in a same row.

The second corner pixels may include second light-emitting element sets and second corner pixel circuits. Some of the second light-emitting element sets may be arranged (and aligned) in a same column and may be electrically connected to some of the second corner pixel circuits arranged in different columns.

The first corner pixels may include first light-emitting element sets and first corner pixel circuits. The first corner pixel may include a red light-emitting element, a green light-emitting element, and a blue light-emitting element that are respectively electrically connected to three of the first corner pixel circuits that are arranged (and aligned) in the second direction.

The second corner pixels may include second light-emitting element sets and second corner pixel circuits. The second corner pixel may include a red light-emitting element, a green light-emitting element, and a blue light-emitting element that are respectively electrically connected to three of the second corner pixel circuits that are arranged (and aligned) in the first direction.

The third direction may be oblique relative to each of the second direction and the first direction.

The display panel may further include a corner driving circuit configured to provide scan signals. At least some light-emitting elements of the first corner pixels or at least some light-emitting elements of the second corner pixels overlap the corner driving circuit.

The display panel may further include a substrate that includes a main area and a strip. The strip may protrude relative to the main area. The main pixels may be positioned in the main area. Some of the first corner pixels may be positioned in the strip and may be arranged in at least three columns between two opposite edges of the strip in a plan view of the display panel.

The first corner pixel may include a red light-emitting element, a green light-emitting element, and a blue light-emitting element. One side of the blue light-emitting element may be opposite each of one side of the red light-emitting element and one side of the green light-emitting element.

An embodiment may be related to a display apparatus. The display apparatus may include the following elements: main pixels including a main pixel; a third data line electrically connected to the main pixel and extending lengthwise in a third direction; first corner pixels arranged at a corner of the display apparatus and including a first corner pixel; a first data line electrically connected to the first corner pixel and extending lengthwise in a first direction; second corner pixels arranged between the first corner pixels and the main pixels and including a second corner pixel; and a second data line electrically connected to the second corner pixel and extending lengthwise in a second direction. The first direction, the second direction, and the third direction may be different from each other.

The first corner pixel may include a first switching transistor. The first switching transistor may include a first source electrode, a first drain electrode, and a first gate electrode. The first gate electrode may be positioned between the first source electrode and the first drain electrode in the first direction. The first source electrode may be electrically connected to the first data line. The second corner pixel may include a second switching transistor. The second switching transistor may include a second source electrode, a second drain electrode, and a second gate electrode. The second gate electrode may be positioned between the second source electrode and the second drain electrode in the second direction. The second source electrode may be electrically connected to the second data line.

The first corner pixels may include first light-emitting element sets and first corner pixel circuits. Light-emitting elements of some of the first light-emitting element sets that are aligned in the second direction may be all electrically connected to some of the first corner pixel circuits that are arranged (and aligned) in a same row.

The second corner pixels may include second light-emitting element sets and second corner pixel circuits. Some of the second light-emitting element sets may be arranged (and aligned) in a same column and may be electrically connected to some of the second corner pixel circuits that are arranged in different columns.

The first corner pixels may include first light-emitting element sets and first corner pixel circuits. The first corner pixel may include a red light-emitting element, a green light-emitting element, and a blue light-emitting element that are respectively electrically connected to three of the first corner pixel circuits that are arranged in the second direction.

The second corner pixels may include second light-emitting element sets and second corner pixel circuits. The second corner pixel may include a red light-emitting element, a green light-emitting element, and a blue light-emitting element that are respectively electrically connected to three of the second corner pixel circuits that are arranged (and aligned) in the first direction.

The third direction may be oblique relative to each of the first direction and the second direction.

The display apparatus may further include a corner driving circuit configured to provide scan signals. At least some light-emitting elements of the first corner pixels or at least some light-emitting elements of the second corner pixels overlap the corner driving circuit.

The display apparatus may further include a substrate that includes a main area and a strip. The strip may protrude relative to the main area. The main pixels may be positioned in the main area. Some of the first corner pixels may be positioned in the strip and may be arranged in at least three columns between two opposite edges of the strip in a plan view of the display apparatus.

The first corner pixel may include a red light-emitting element, a green light-emitting element, and a blue light-emitting element. One side of the blue light-emitting element may be opposite each of one side of the red light-emitting element and one side of the green light-emitting element.

DETAILED DESCRIPTION

Figure 1:
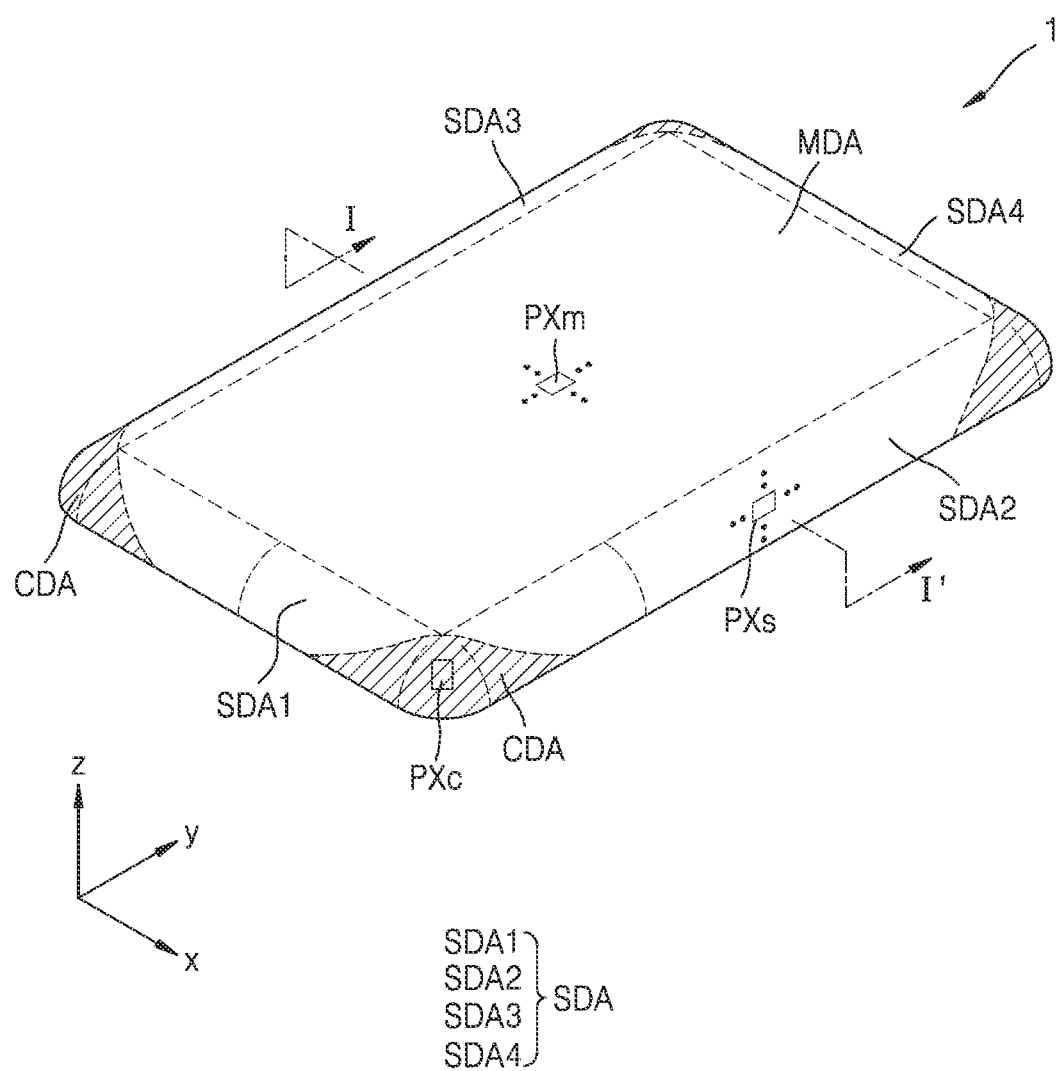
FIG. 1 is a schematic perspective view of a display apparatus according to an embodiment.

Examples of embodiments are illustrated in the accompanying drawings, wherein like reference numerals may refer to like elements. Practical embodiments may have different forms and should not be construed as being limited to the described embodiments.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element may be directly on the second element, or one or more intervening elements may be present between the first element and the second element. Dimensions of elements in the drawings may be exaggerated or contracted for convenience of descriptions.

The term "on" may mean "directly on" or "indirectly on." The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate.

In the illustrated embodiments, the x-axis/direction, the y-axis/direction, and the z-axis/direction may be perpendicular to one another, or two or more of the x-axis/direction, the y-axis/direction, and the z-axis/direction may not be perpendicular to each other.

FIG. 1 is a schematic perspective view of a display apparatus 1 according to an embodiment.

The display apparatus 1 may display a video or a still image in response to input signals. The display apparatus 1 may include, may be, or may be included in at least one of a mobile phone, a smartphone, a tablet personal computer (PC), a smartwatch, a watch phone, a mobile communication terminal, an electronic notebook, an electronic book, a portable multimedia player (PMP), a navigation apparatus, an ultra-mobile PC (UPMC), a televisions, a laptop computer, a monitor, a billboard, and an Internet-of-Things (loT) device.

The display apparatus 1 may include a main display area MDA, side display areas SDA, and corner display areas CDA.

The display apparatus 1 may have a thickness in a z-direction. The main display area MDA may be arranged in a front portion of the display apparatus 1 and may be non-bendable and flat. The main display area MDA may have a substantially rectangular shape including short sides in an x-direction and long sides in a y-direction. The main display area MDA may have one or more polygonal shapes other than a rectangle. The main display area MDA may have round corners where sides meet.

The side display areas SDA may include a first side display area SDA1, a second side display area SDA2, a third side display area SDA3, and a fourth side display area SDA4.

The first side display area SDA1 may extend from a first side of the main display area MDA and may be bent at a certain curvature. The first side display area SDA1 may extend from the lower side of the main display area MDA. The first side display area SDA1 may be arranged on the lower side of the display apparatus 1.

The second side display area SDA2 may extend from a second side of the main display area MDA and may be bent at a certain curvature. The second side display area SDA2 may extend from the right side of the main display area MDA. The second side display area SDA2 may be arranged on the right side of the display apparatus 1.

The third side display area SDA3 may be extend from a third side of the main display area MDA and may be bent at a certain curvature. The third side display area SDA3 may extend from the left side of the main display area MDA. The third side display area SDA3 may be arranged on the left side of the display apparatus 1.

The fourth side display area SDA4 may extend from a fourth side of the main display area MDA and may be bent at a certain curvature. The fourth side display area SDA4 may extend from the upper side of the main display area MDA. The fourth side display area SDA4 may be arranged on the upper side of the display apparatus 1.

A corner display area CDA may be extend from a corner of the main display area MDA and may be bent at a certain curvature. A corner display area CDA may be between a corresponding pair of the first to fourth side display areas SDA1 to SDA4. A corner display area CDA may be between the first side display area SDA1 and the second side display area SDA2. A corner display area CDA may be between the first side display area SDA1 and the third side display area SDA3. A corner display area CDA may be between the second side display area SDA2 and the fourth side display area SDA4. A corner display area CDA may be between the third side display area SDA3 and the fourth side display area SDA4.

The display apparatus 1 may provide an image using main pixels PXm arranged in the main display area MDA, side pixels PXs arranged in the side display areas SDA, and corner pixels PXc arranged in the corner display areas CDA.

An image displayed in a corner display area CDA and/or a side display area SDA may be an auxiliary image and may have a resolution lower than that of an image displayed in the main display area MDA. The number of corner pixels PXc arranged per unit area in a corner display area CDA may be less than the number of main pixels PXm arranged per unit area in the main display area MDA. A resolution of the side display area SDA may be lower than or equal to a resolution of the main display area MDA.

Figure 2:
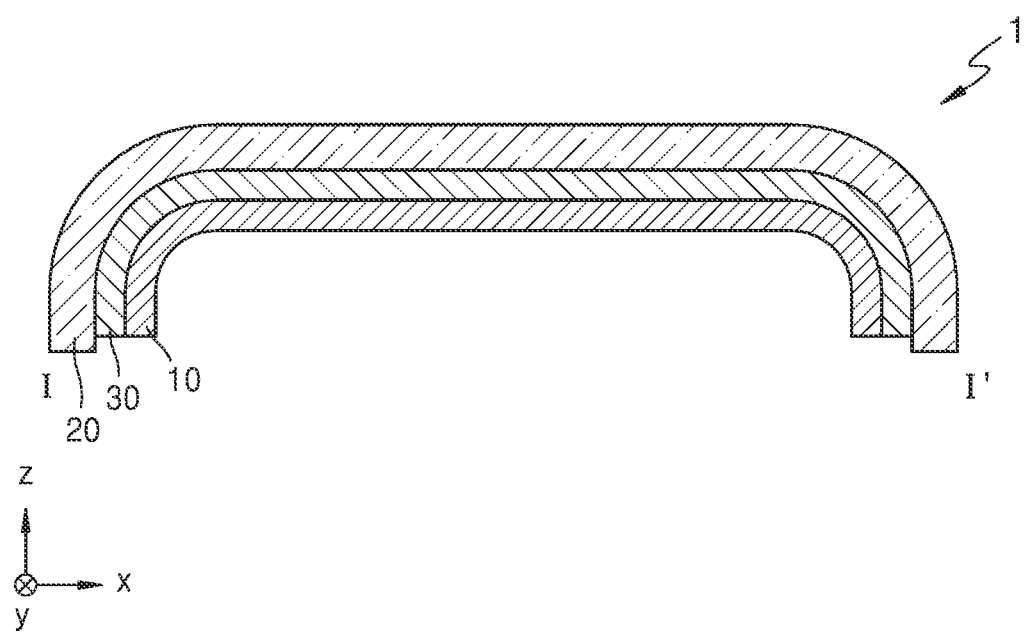
FIG. 2 is a cross-sectional view of the display apparatus taken along a line I-I' of FIG. 1 according to embodiment.

FIG. 2 is a cross-sectional view of the display apparatus 1 taken along a line I-I' of FIG. 1 according to an embodiment.

Referring to FIG. 2, the display apparatus 1 may include a display panel 10, and a cover window 20 arranged on the display panel 10.

The cover window 20 may cover and protect the display panel 10. The cover window 20 may include a transparent material. The cover window 20 may include, for example, glass or plastic. The cover window 20 may be flexible or rigid.

A shape of the cover window 20 corresponds to a shape of the display apparatus 1. Since the display apparatus 1 includes the side display areas SDA and the corner display areas CDA, the cover window 20 may include side portions corresponding to the side display areas SDA and may include corner portions corresponding to the corner display areas CDA. The side portions and the corner portions of the cover window 20 may have curved surfaces, which may have a constant curvature or multiple curvatures.

The display panel 10 may be substantially overlapped by the cover window 20 in the z-direction. The cover window 20 and the display panel 10 may be coupled to each other via an adhesive member 30. The adhesive member 30 may include an optically cleared adhesive (OCA) film or an optically cleared resin (OCR).

Figure 3A:
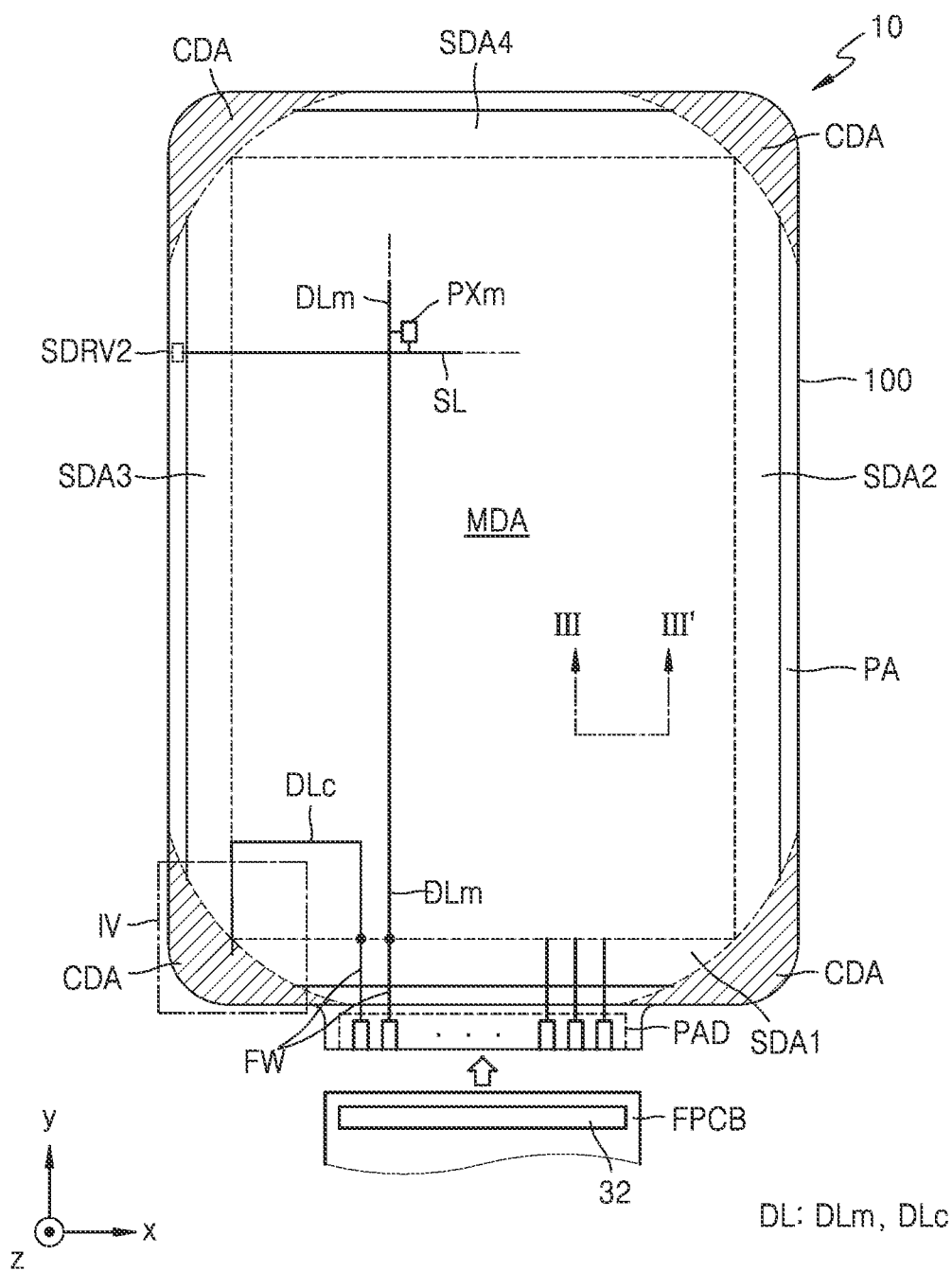
FIG. 3A is a schematic plan view of a display panel that, after being bent, may be included in the display apparatus of FIG. 1 according to an embodiment.
Figure 3B:
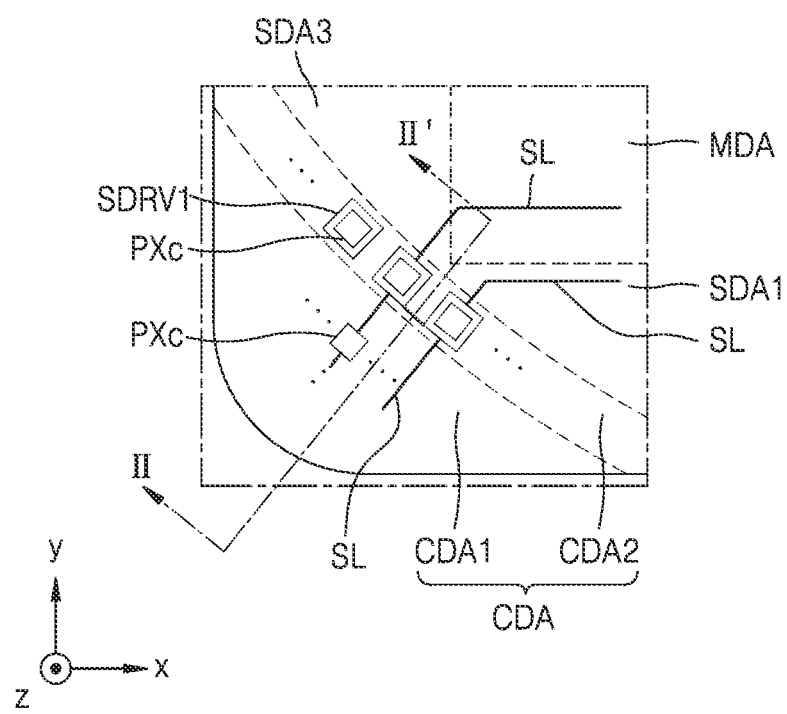
FIG. 3B is an enlarged view of an area IV of FIG. 3A according to an embodiment.

FIG. 3A is a schematic plan view of a display panel 10 that, after being bent, may be included in the display apparatus 1 of FIG. 1 according to an embodiment. FIG. 3B is an enlarged view of an area IV of FIG. 3A according to an embodiment.

Referring to FIGS. 3A and 3B, various elements constituting the display panel 10 may be disposed on a substrate 100. The substrate 100 may include a main display area MDA, side display areas SDA1, SDA2, SDA3, and SDA4, and corner display areas CDA that correspond to the main display area MDA, side display areas SDA, and corner display area CDA of the display apparatus 1. The substrate 100 may include a peripheral area PA.

A plurality of main pixels PXm may be arranged in the main display area MDA, and a main image may be displayed by the main pixels PXm. Each of the main pixels PXm may include a set of subpixels. Each subpixel may emit red, green, blue, or white light.

The side display areas SDA1, SDA2, SDA3, and SDA4 may be arranged on the upper, lower, left, and right sides of the main display area MDA. A plurality of side pixels PXs may be arranged in each of the side display areas SDA1, SDA2, SDA3, and SDA4, and side images may be displayed by the side pixels PXs. The side images may form one whole image together with the main image, or one or more of the side images may be independent from the main image.

Each corner display area CDA may extend from a corner of the main display area MDA. Each side display area SDA1, SDA2, SDA3, or SDA4 may be between two corner display areas CDA. A plurality of corner pixels PXc may be arranged in each corner display area CDA, and corner images may be displayed by the corner pixels PXc. The corner images may form one whole image together with the main image and the side images, or one or more of the corner image may be independent from the main image and/or the side images.

Referring to FIG. 3B, a corner display area CDA may include a first corner display area CDA1 and a second corner display area CDA2. The first corner display area CDA1 may be arranged closer to an edge (and a closest corner) of the substrate 100 than the second corner display area CDA2, and the second corner display area CDA2 may be between the first corner display area CDA1 and the main display area MDA.

In addition to corner pixels PXc, a corner driving circuit SDRV1 may be arranged in the second corner display area CDA2. The corner driving circuit SDRV1 may provide scan signals for driving the corner pixels PXc arranged in the corresponding corner display area CDA. The corner driving circuit SDRV1 may provide scan signals for driving the main pixels PXm arranged in the main display area MDA and/or the side pixels PXs arranged in one or more side display areas SDA1, SDA2, SDA3, or SDA4. The corner driving circuit SDRV1 may substantially simultaneously provide instances of the same scan signal to pixel circuits of at least some corner pixels PXc and pixel circuits of at least some main pixels PXm. Two scan line SL may respectively extend to the main display area MDA and a corner display area CDA from two sides of the corner driving circuit SDRV1.

The peripheral area PA may be arranged outside the side display area SDA. A main driving circuit SDRV2 and a terminal PAD may be provided in the peripheral area PA.

The main driving circuit SDRV2 may provide scan signals for driving the main pixels PXm and the side pixels PXs. The main driving circuit SDRV2 may be arranged on the right side of the second side display area SDA2 and/or on the left side of the third side display area SDA3, and may be connected to a scan line SL extending in an x-direction.

The terminal PAD may be arranged below the first side display area SDA1. The terminal PAD is exposed (without being covered) by an insulating layer and is connected to a display circuit board FPCB. A display driver 32 may be arranged in the display circuit board FPCB.

The display driver 32 may generate control signals transmitted to the corner driving circuit SDRV1 and the main driving circuit SDRV2. The display driver 32 may generate data signals to be transmitted to the pixels PXm, PXs, and PXc through fan-out wires FW and data lines DL connected to the fan-out wires FW. Main data lines DLm may extend in a y-direction and may be connected to pixel circuits of the main pixels PXm. A corner data line DLc may be bent in the main display area MDA and may extend to the corresponding corner display area CDA. The corner data line DLc may be connected to pixel circuits of corner pixels PXc.

Figure 4:
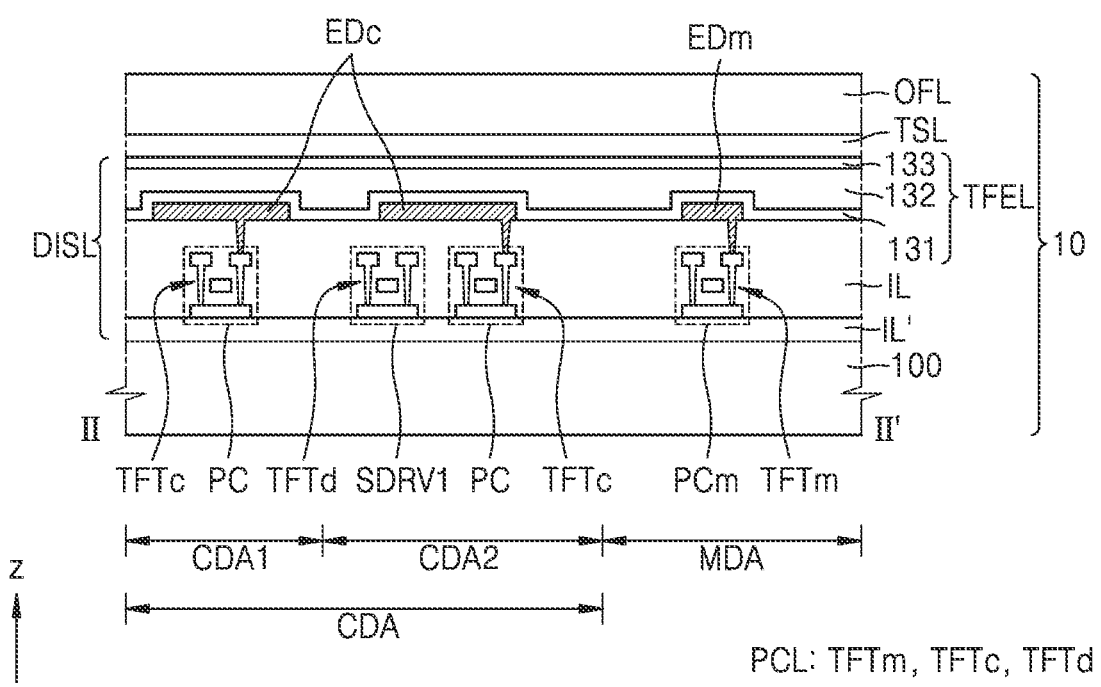
FIG. 4 is a schematic cross-sectional view of a portion of a display panel corresponding to a line II-II' of FIG. 3B according to an embodiment.

FIG. 4 is a schematic cross-sectional view of a portion of a display panel 10 corresponding to a line II-II' of FIG. 3B according to an embodiment.

Referring to FIG. 4, the display panel 10 may include a corner display area CDA and the main display area MDA, and the corner display area CDA may include a first corner display area CDA1 and a second corner display area CDA2. The display panel 10 may include the substrate 100, and a display layer DISL, a touch screen layer TSL, and an optical functional layer OFL on the substrate 100.

The display layer DISL may include a circuit layer PCL including thin-film transistors TFTm, TFTc, and TFTd, a display element layer including light-emitting elements EDm and EDc that are display elements, and a thin-film encapsulation layer TFEL. Insulating layers IL and IL' may be arranged in the display layer DISL and arranged between the substrate 100 and the thin-film encapsulation layer TFEL.

The substrate 100 may include an insulating material such as glass, quartz, or a polymer resin. The substrate 100 may be/include a rigid substrate or a flexible substrate that is bendable, foldable, and/or rollable.

A main pixel circuit PCm and a main light-emitting element EDm connected thereto may be arranged in the main display area MDA of the display panel 10. The main pixel circuit PCm may include at least one thin-film transistor TFTm and may control light emission of the main light-emitting element EDm.

A corner pixel circuit PC and a corner light-emitting element EDc connected thereto may be arranged in each of the first corner display area CDA1 and the second corner display area CDA2 of the display panel 10. The corner pixel circuit PC may include at least one thin-film transistor TFTc and may control light emission of the corner light-emitting element EDc.

A corner driving circuit SDRV1 may be arranged in the second corner display area CDA2. The corner driving circuit SDRV1 may include at least one thin-film transistor TFTd and may provide scan signals to the corner pixel circuits PC arranged in the corner display area CDA. The corner light-emitting elements EDc arranged in the first corner display area CDA1 and the second corner display area CDA2 may be arranged in the same pixel arrangement. Due to a uniform pixel arrangement of the corner light-emitting elements EDc, the corner light-emitting element EDc may overlap the corner driving circuit SDRV1 in the second corner display area CDA2.

The corner display area CDA is an auxiliary display area, and a resolution of the corner display area CDA may be less than that of the main display area MDA. The number per unit area (or density) of the corner light-emitting elements EDc arranged in the corner display area CDA may be less than the number per unit area (or density) of the main light-emitting elements EDm arranged in the main display area MDA.

The corner light-emitting element EDc arranged in the corner display area CDA may be larger than the main light-emitting element EDm arranged in the main display area MDA. An emission area of the corner light-emitting element EDc may be larger than an emission area of the main light-emitting element EDm arranged in the main display area MDA. Therefore, the corner display area CDA may provide luminance that is substantially as much as the luminance provided by the main display area MDA even with a lower resolution of the corner display area CDA.

The main light-emitting element EDm and the corner light-emitting element EDc, which are display elements, may be covered by the thin-film encapsulation layer TFEL. The thin-film encapsulation layer TFEL may include at least one inorganic encapsulation layer and at least one organic encapsulation layer. The thin-film encapsulation layer TFEL may include a first inorganic encapsulation layer 131, a second inorganic encapsulation layer 133, and an organic encapsulation layer 132 between the first inorganic encapsulation layer 131 and the second inorganic encapsulation layer 133.

The first inorganic encapsulation layer 131 and the second inorganic encapsulation layer 133 may each include at least one inorganic insulating material, such as at least one of silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_x$, which may be ZnO and/or $ZnO_2$), and may each be formed by chemical vapor deposition (CVD) or the like. The organic encapsulation layer 132 may include a polymer-based material. The polymer-based material may include at least one of a silicon-based resin, an acrylic resin, an epoxy-based resin, polyimide, and polyethylene.

The touch screen layer TSL may obtain coordinate information according to an external input, for example, a touch event. The touch screen layer TSL may include a touch electrode, and touch lines connected to the touch electrode. The touch screen layer TSL may sense an external input based on a self-capacitance method or a mutual capacitance method.

The touch screen layer TSL may be formed on the thin-film encapsulation layer TFEL. The touch screen layer TSL may be separately formed on a touch substrate, and then coupled to the thin-film encapsulation layer TFEL through an adhesive layer, such as an optically clear adhesive (OCA). The touch screen layer TSL may be directly formed on the thin-film encapsulation layer TFEL, and no adhesive layer may be between the touch screen layer TSL and the thin-film encapsulation layer TFEL.

The optical functional layer OFL may include an anti-reflection layer. The anti-reflection layer may reduce the reflectance of light (external light) incident from the outside toward the display apparatus 1. The optical functional layer OFL may include a polarization film. The optical functional layer OFL may include a filter plate including a black matrix and color filters.

The display panel 10 may be/include a light-emitting display panel including a light-emitting element. For example, the display panel 10 may be/include an organic light-emitting display panel using an organic light-emitting diode (LED) as a light-emitting element, a micro LED display panel using a micro LED as a light-emitting element, a quantum dot organic light-emitting display panel using a quantum dot and an organic LED, or an inorganic light-emitting display panel using an inorganic semiconductor as a light-emitting element. In the following illustrative examples, the display panel 10 is an organic light-emitting display panel.

Figure 5:
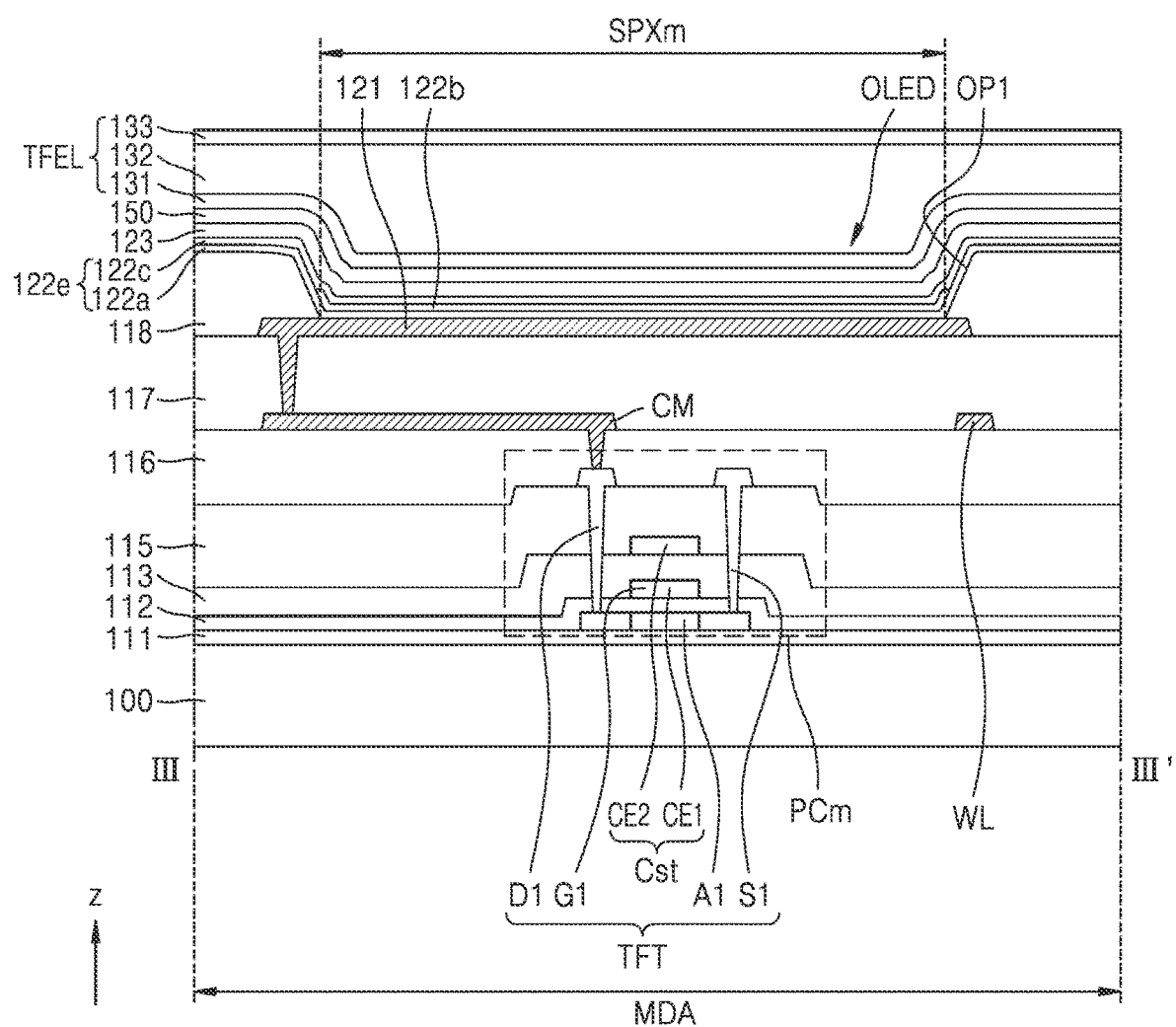
FIG. 5 is a schematic cross-sectional view of a portion of a display panel corresponding to a line III-III' of FIG. 3A according to an embodiment.

FIG. 5 is a schematic cross-sectional view of a portion of a display panel 10 corresponding to a line III-III' of FIG. 3A according to an embodiment.

Referring to FIG. 5, a main pixel circuit PCm (including at least one thin-film transistor TFT and a storage capacitor Cst) and an organic light-emitting diode OLED (as a display element connected to the main pixel circuit PCm) may be arranged in the main display area MDA. One main subpixel SPXm may correspond to an emission area of the organic light-emitting diode OLED.

The substrate 100 may include an insulating material such as glass, quartz, or a polymer resin. The substrate 100 may be/include a rigid substrate or a flexible substrate that is bendable, foldable, and/or rollable. The substrate 100 may have a stacked structure of an organic layer-an inorganic layer-an organic layer.

A buffer layer 111 may be disposed on the substrate 100 to reduce or block the penetration of foreign materials, moisture, or external air from below the substrate 100 and may provide a flat surface over the substrate 100. The buffer layer 111 may include an inorganic material, such as oxide or nitride, may include an organic material, or may include an organic-inorganic composite and may have a single-layered or multi-layered structure of an inorganic material and an organic material. A barrier layer (not shown) that blocks the penetration of external air may be included between the substrate 100 and the buffer layer 111. The buffer layer 111 may include $SiO_x$ and/or $SiN_x$.

The thin-film transistor TFT may be disposed on the buffer layer 111. The thin-film transistor TFT may include a first semiconductor layer A1, a first gate electrode G1, a first source electrode S1, and a first drain electrode D1. The thin-film transistor TFT may be connected to the organic light-emitting diode OLED and may drive the organic light-emitting diode OLED.

The first semiconductor layer A1 may be disposed on the buffer layer 111 and may include polysilicon. The first semiconductor layer A1 may include amorphous silicon. The first semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel region, and may include a source region and a drain region doped with impurities.

A first gate insulating layer 112 may cover the first semiconductor layer A1. The first gate insulating layer 112 may include an inorganic insulating material, such as $SiO_x$, $SiN_x$, $SiO_xN_y$, $Al_2O_3$, $TiO_2$, $Ta_2O_5$, $HfO_2$, or $ZnO_x$ (which may be ZnO and/or $ZnO_2$). The first gate insulating layer 112 may include a single layer or multi-layer structure.

The first gate electrode G1 is disposed on the first gate insulating layer 112 and may overlap the first semiconductor layer A1. The first gate electrode G1 may include molybdenum (Mo), aluminum (Al), copper (Cu), or Ti, and may include a single layer or multi-layer structure. For example, the first gate electrode G1 may include a single Mo layer.

A second gate insulating layer 113 may cover the first gate electrode G1. The second gate insulating layer 113 may include an inorganic insulating material, such as $SiO_x$, $SiN_x$, $SiO_xN_y$, $Al_2O_3$, $TiO_2$, $Ta_2O_5$, $HfO_2$, or $ZnO_x$ (which may be ZnO and/or $ZnO_2$). The second gate insulating layer 113 may include a single layer or multi-layer structure.

An upper electrode CE2 of the storage capacitor Cst may be disposed on the second gate insulating layer 113. The upper electrode CE2 of the storage capacitor Cst may overlap the first gate electrode G1. The first gate electrode G1 and the upper electrode CE2 with the intervening second gate insulating layer 113 may constitute the storage capacitor Cst. The first gate electrode G1 may be a lower electrode CE1 of the storage capacitor Cst.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu and may include a single layer or multi-layer structure.

An interlayer insulating layer 115 may cover the upper electrode CE2. The interlayer insulating layer 115 may include $SiO_x$, $SiN_x$, $SiO_xN_y$, $Al_2O_3$, $TiO_2$, $Ta_2O_5$, $HfO_2$, or ZnO$_x$ (which may be ZnO and/or ZnO$_2$). The interlayer insulating layer 115 may have a single-layered or multi-layered structure.

A source electrode S1 and a drain electrode D1 may be disposed on the interlayer insulating layer 115. The source electrode S1 and the drain electrode D1 may each include a conductive material including Mo, Al, Cu, or Ti, and may each include a single layer or multi-layer structure. For example, the source electrode S1 and the drain electrode D1 may each have a multi-layered structure of Ti—Al—Ti.

A first organic insulating layer 116 may be disposed on the source electrode S1 and the drain electrode D1. The first organic insulating layer 116 may include a general-purpose polymer, such as polyimide (e.g., photosensitive polyimide), polystyrene (PS), polycarbonate (PC), benzocyclobutene (BCB), hexamethyldisiloxane (HMDSO), or polymethylmethacrylate (PMMA), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

The first organic insulating layer 116 may include a siloxane-based organic material. The siloxane-based organic material may include hexamethyldisiloxane, octamethyltrisiloxane, decamethyltetrasiloxane, dodecamethylpentasiloxane, and/or polydimethylsiloxane.

A connection electrode CM and conductive wires WL, for example, a driving voltage line or a data line, may be disposed on the first organic insulating layer 116.

A second organic insulating layer 117 may be disposed on the first organic insulating layer 116 to cover the connection electrode CM and the conductive wires WL. The second organic insulating layer 117 may have a flat upper surface so that an overlying pixel electrode 121 may be sufficiently flat. The second organic insulating layer 117 may include a siloxane-based organic material having high light transmittance and high flatness. The siloxane-based organic material may include hexamethyldisiloxane, octamethyltrisiloxane, decamethyltetrasiloxane, dodecamethylpentasiloxane, and/or polydimethylsiloxane.

The second organic insulating layer 117 may include a general-purpose polymer, such as polyimide (e.g., photosensitive polyimide), BCB, HMDSO, PMMA or PS, polymer derivatives having a phenol-based group, an acrylic polymer, an imide-based polymer, an aryl ether-based polymer, an amide-based polymer, a fluorine-based polymer, a p-xylene-based polymer, or a vinyl alcohol-based polymer.

The organic light-emitting diode OLED may be arranged on the second organic insulating layer 117. The pixel electrode 121 of the organic light-emitting diode OLED may be connected to the main pixel circuit PCm through the connection electrode CM disposed on the first organic insulating layer 116.

The pixel electrode 121 may include a conductive oxide, such as indium tin oxide (ITO), indium zinc oxide (IZO), zinc oxide (ZnO), indium oxide (In$_2$O$_3$), indium gallium oxide (IGO), or aluminum zinc oxide (AZO). The pixel electrode 121 may include a reflective layer including Ag, Mg, Al, Pt, Pd, Au, Ni, Nd, Ir, Cr, or a compound/alloy of some of the metals. The pixel electrode 121 may include layers on and/or under the reflective layer and/or the conductive oxide layer. The pixel electrode 121 may have a stacked structure of ITO-Ag-ITO.

On the second organic insulating layer 117, a pixel-defining layer 118 may include a first opening OP1 that covers an edge of the pixel electrode 121 and exposes a central portion of the pixel electrode 121. An emission area of organic light-emitting diodes OLED, that is, a size and a shape of a main subpixel SPXm, is defined by the first opening OP1.

The pixel-defining layer 118 may prevent arcs or the like from occurring at the edge of the pixel electrode 121 by increasing a distance between the edge of pixel electrodes 121 and an opposite electrode 123. The pixel-defining layer 118 may include an organic insulating material, such as polyimide, an acrylic resin, BCB, HMDSO, and/or a phenolic resin, and may be formed by spin coating or the like.

A first light-emitting layer 122b may overlap the pixel electrode 121 and may be partially arranged in the first opening OP1 of the pixel-defining layer 118. The first light-emitting layer 122b may include a polymer material or a low molecular weight material, and may emit red, green, blue, or white light.

An organic functional layer 122e may be arranged on and/or below the first light-emitting layer 122b. The organic functional layer 122e may include a first functional layer 122a and/or a second functional layer 122c. The first functional layer 122a or the second functional layer 122c may be optional.

The first functional layer 122a may be arranged below the first light-emitting layer 122b. The first functional layer 122a may include a single layer or multi-layer structure including an organic material. The first functional layer 122a may include a hole transport layer (HTL) having a single-layered structure. The first functional layer 122a may include a hole injection layer (HIL) and an HTL. The first functional layer 122a may be formed as one body to correspond to organic light-emitting diodes OLED included in the main display area MDA.

The second functional layer 122c may be disposed on the first light-emitting layer 122b. The second functional layer 122c may include a single layer or multi-layer structure including an organic material. The second functional layer 122c may include an electron transport layer (ETL) and/or an electron injection layer (EIL). The second functional layer 122c may be formed as one body to correspond to the organic light-emitting diodes OLED included in the main display area MDA.

The opposite electrode 123 may be disposed on the second functional layer 122c. The opposite electrode 123 may include a conductive material having a low work function. As an example, the opposite electrode 123 may include a (semi-)transparent layer including Ag, Mg, Al, Pt, Pd, Au, Ni, Nd, Ir, Cr, Li, Ca, or an alloy of some of the metals. The opposite electrode 123 may further include an overlying layer on the (semi-)transparent layer. The overlying layer may include ITO, IZO, ZnO, or In$_2$O$_3$. The opposite electrode 123 may overlap multiple pixel electrodes 121 of multiple organic light-emitting diodes OLED included in the main display area MDA.

Layers from the pixel electrode 121 to the opposite electrode 123 formed in the main display area MDA may constitute the organic light-emitting diode OLED.

An upper layer 150 including an organic material may be formed on the opposite electrode 123. The upper layer 150 may protect the opposite electrode 123 and may increase light extraction efficiency. The upper layer 150 may include an organic material having a refractive index higher than that of the opposite electrode 123. The upper layer 150 may include a stack of layers having different refractive indexes. For example, the upper layer 150 may include a stack of a first high refractive index layer, a low refractive index layer, and a second high refractive index layer. A refractive index of each of the high refractive index layers may be 1.7 or more, and a refractive index of the low refractive index layer may be 1.3 or less.

The upper layer 150 may include lithium fluoride (LiF). The upper layer 150 may include an inorganic insulating material such as $SiO_x$ or $SiN_x$.

The thin-film encapsulation layer TFEL may be disposed on the upper layer 150. The thin-film encapsulation layer TFEL may prevent external moisture or foreign materials from penetrating into the organic light-emitting diode OLED.

The thin-film encapsulation layer TFEL may include at least one inorganic encapsulation layer and at least one organic encapsulation layer. FIG. 5 illustrates that the thin-film encapsulation layer TFEL includes the first inorganic encapsulation layer 131, the organic encapsulation layer 132, and the second inorganic encapsulation layer 133. The number of organic encapsulation layers, the number of inorganic encapsulation layers, and the stacking order in the thin-film encapsulation layer TFEL may depend on embodiments.

The first inorganic encapsulation layer 131 and the second inorganic encapsulation layer 133 may each include at least one inorganic insulating material, such as $SiO_x$, $SiN_x$, $Si_xN_y$, $Al_2O_3$, $TiO_2$, $Ta_2O_5$, $HfO_2$, or $ZnO_x$ (which may be ZnO and/or $ZnO_2$), and may each be formed by CVD or the like. The organic encapsulation layer 132 may include a polymer-based material. The polymer-based material may include a silicon-based resin, an acrylic resin, an epoxy-based resin, polyimide, and/or polyethylene. The first inorganic encapsulation layer 131, the organic encapsulation layer 132, and the second inorganic encapsulation layer 133 may be formed as one body to cover the main display area MDA.

The stacked structure of the main display area MDA described with reference to FIG. 5 may be analogously applied to a side display area SDA and a corner display area CDA.

Figure 6A:
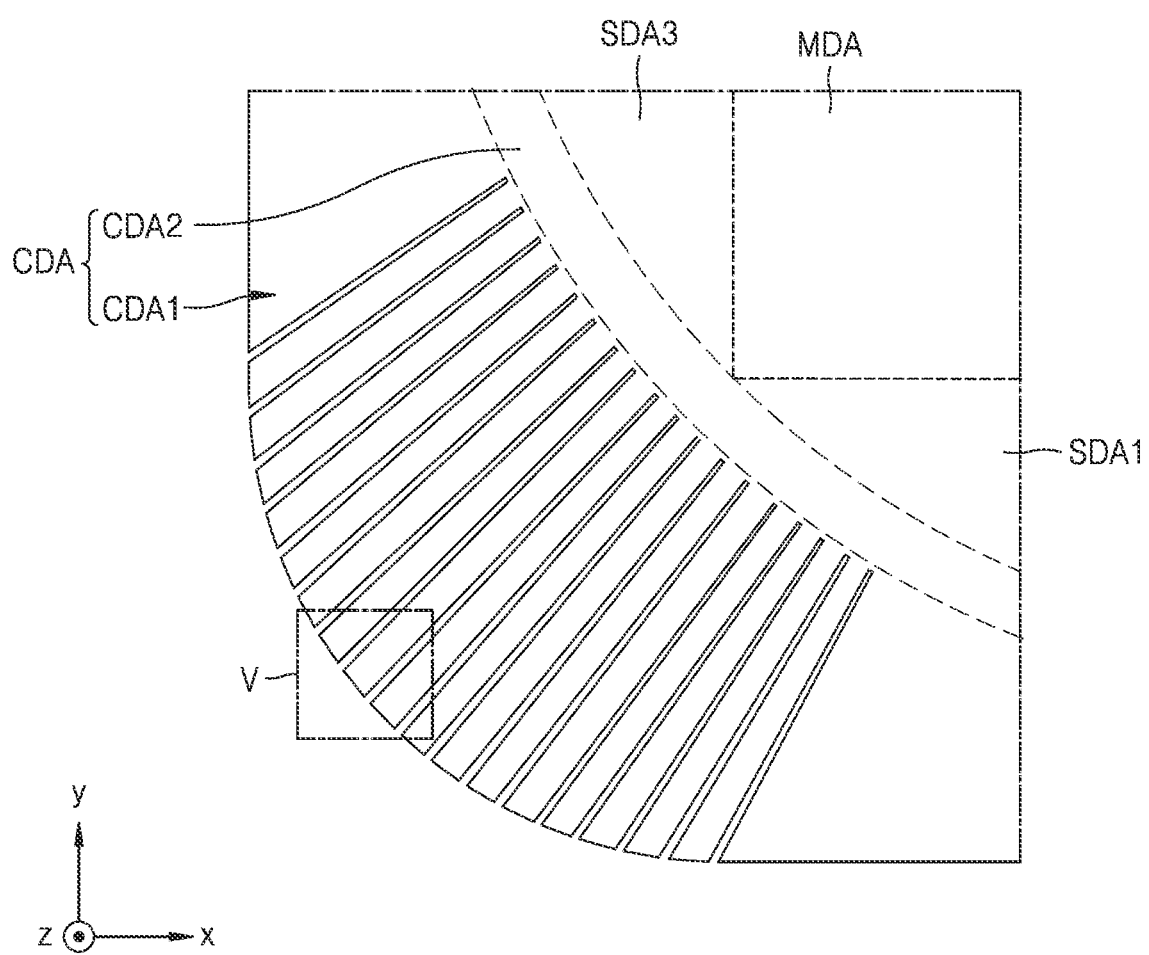
FIG. 6A is an enlarged plan view of a portion of a display panel according to an embodiment.
Figure 6B:
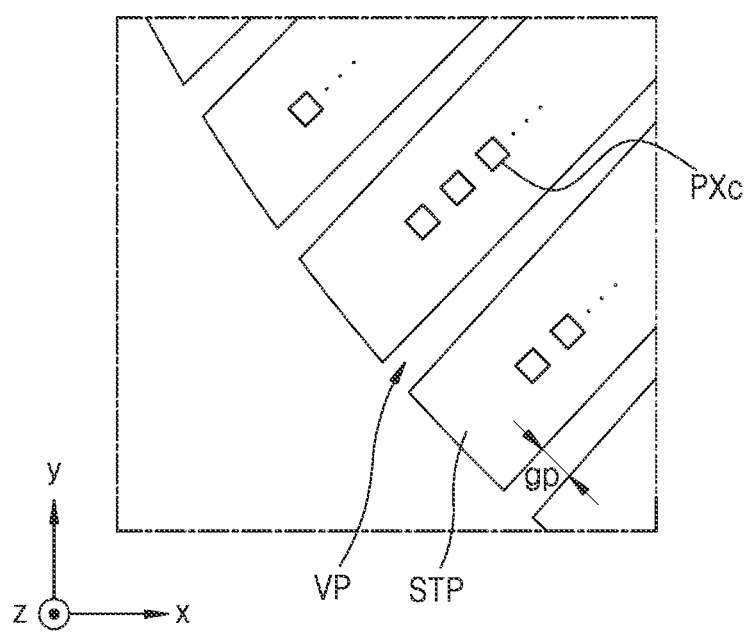
FIG. 6B is an enlarged view of an area V of FIG. 6A according to an embodiment.

FIG. 6A is an enlarged plan view of a portion of a display panel 10 according to an embodiment. FIG. 6B is an enlarged view of an area V of FIG. 6A according to an embodiment. FIG. 6A illustrates that the display panel 10 is not bent and that the corner display area CDA is flat.

Referring to FIGS. 6A and 6B, the display panel 10 may include a plurality of strips STP and a plurality of openings VP (or cuts VP) in a corner display area CDA, particularly in the first corner display area CDA1 of the corner display area CDA. The openings VP may be between the strips STP and may be formed by cutting the substrate 100. The plurality of openings VP may be formed through the thickness of the display panel 10 (in the z-direction).

Ends of the strips STP may be spaced apart from each other by a certain gap gp. Empty spaces may be formed between the strips STP, and each of the empty spaces may correspond to one of the openings VP. The gap gp between the strips STP may vary. For example, as shown in FIG. 6A, the gap gp between two immediately adjacent strips STP may increase from the main display area MDA toward the corner of the corner display area CDA. The gap gp between two immediately adjacent strips STP may be constant along the length of the corresponding opening VP. The strips STP may be radially arranged or may be arranged parallel to each other.

The strips STP may be connected to each other through the second corner display area CDA2 adjacent to the main display area MDA. The strips STP may protrude relative to the main display area MDA. Extension lengths of the strips STP may be different from each other. The extension lengths of the strips STP may depend on the positions of the strips STP relative to the center of the corner display area CDA. For example, among the strips STP, strips STP positioned at the center of the corner display area CDA may have extension lengths longer than those of other strips STP. For the strips STP arranged farther from the center of the corner display area CDA, the extension lengths of the strips STP may be shorter.

Each of the openings VP may reach front and rear surfaces of the display panel 10. The openings VP may improve flexibility of the display panel 10. When external force (bending or pulling force) is applied to the display panel 10, shapes of the openings VP may change to mitigate stress generated during deformation of the display panel 10, thereby improving durability of the display panel 10.

When the external force is applied to the display panel 10, areas or shapes of the openings VP may change, and positions of the strips STP may also change. For example, when the external force is applied to bend edges and/or corners of the display panel 10, the gap gp between the strips STP decreases, areas of the openings VP may decrease, and adjacent strips STP may contact each other.

When the external force is applied to the display panel 10, the gap gp between the strips STP and the areas of the openings VP may change, and shapes of the strips STP may not substantially change. Therefore, pixel circuits and display elements disposed in the strips STP may be protected.

Because the shapes of the strips STP may not substantially change, corner pixels PXc may be arranged in the corner display area CDA of the display panel 10. Accordingly, a display area for displaying an image may extend from the main display area MDA and the side display area SDA to the corner display area CDA. The corner pixels PXc disposed in the strips STP may be spaced apart from each other.

Figure 7:
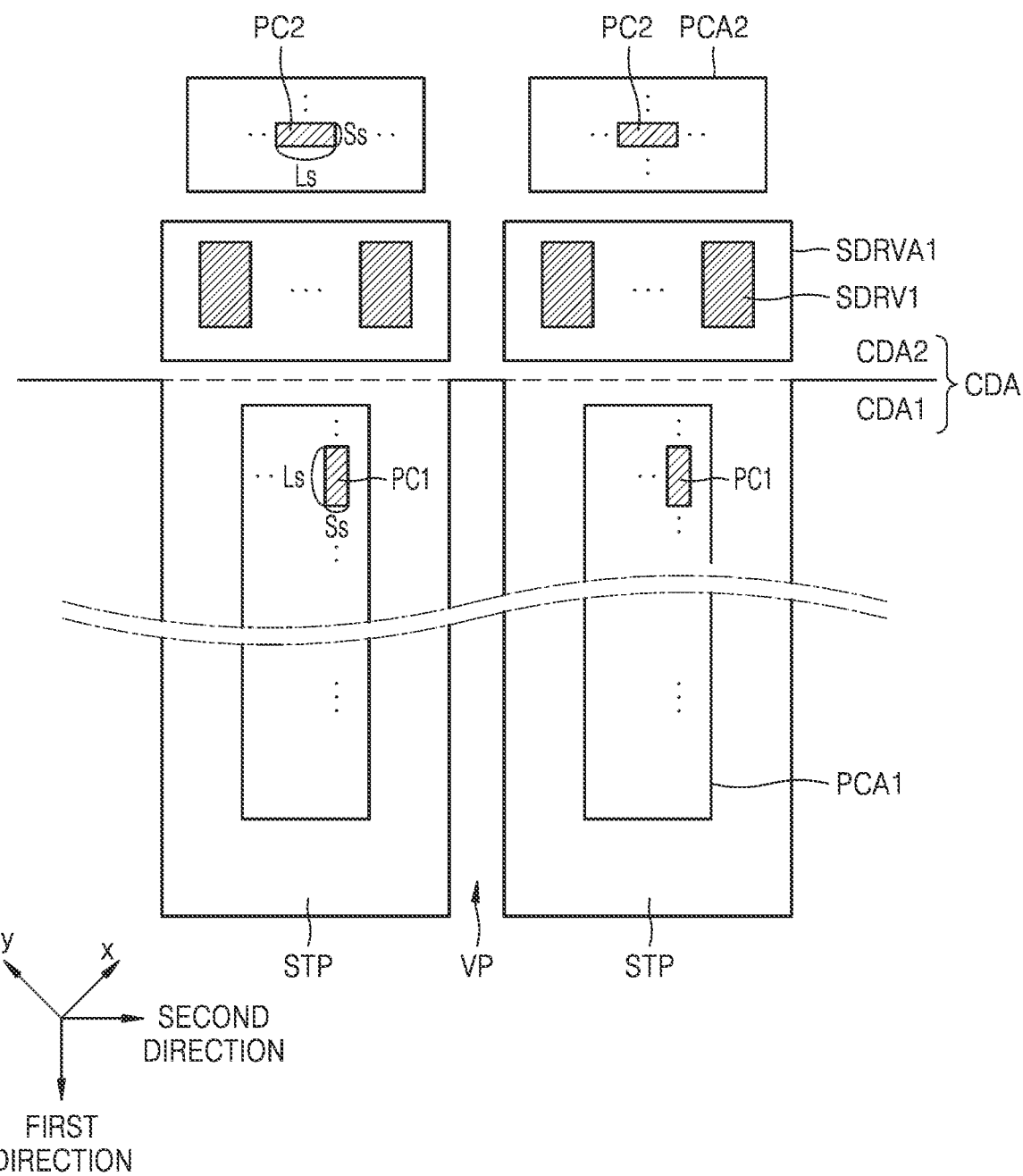
FIG. 7 is a schematic plan view illustrating arrangements of pixel circuits in a corner display area of a display panel according to an embodiment.
Figure 8:
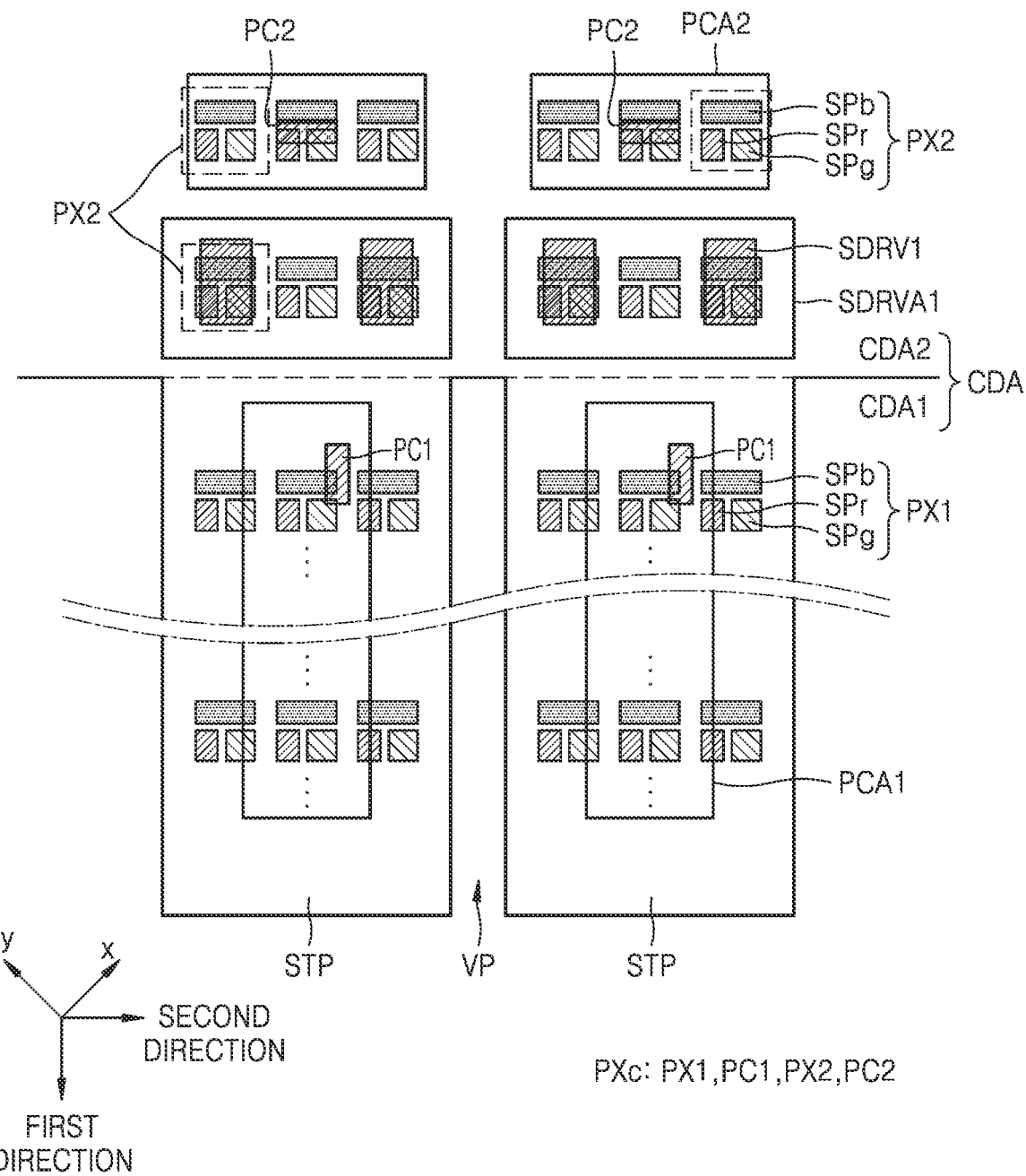
FIG. 8 is a schematic plan view illustrating pixels (or light-emitting element sets of pixels) in a corner display area of a display panel according to an embodiment.

FIG. 7 is a schematic plan view illustrating arrangements of pixel circuits in a corner display area CDA of a display panel 10 according to an embodiment. FIG. 8 is a schematic plan view illustrating pixels (or light-emitting element sets of pixels) in a corner display area CDA of a display panel 10 according to an embodiment.

Referring to FIGS. 3A, 3B, 4, 6A, 6B, 7, and 8, the display panel 10 may include the corner display area CDA, and the corner display area CDA may include the first corner display area CDA1 and the second corner display area CDA2. The first corner display area CDA1 may include a strip STP that extends from the second corner display area CDA2 and is between two adjacent openings VP.

The strip STP may extend from the second corner display area CDA2 in a first direction (FIRST DIRECTION). The first direction may depend on a position of the strip STP. The first direction may be oblique relative to each of the x-direction and the y-direction. The first direction may refer to a lengthwise direction of the strip STP. A second direction (SECOND DIRECTION) may be different from (and substantially perpendicular to) the first direction.

A first pixel circuit area PCA1 may accommodate multiple first corner pixel circuits PC1 and may be arranged in the first corner display area CDA1. The first corner pixel circuits PC1 may drive (or control) subpixels SPr, SPg, and SPb (or light-emitting elements SPr, SPg, and SPb) of a first corner pixel PX1 (or first light-emitting element set PX1) arranged in the first corner display area CDA1. Some of the first corner pixel circuits PC1 may drive subpixels SPr, SPg, and SPb (or light-emitting elements SPr, SPg, and SPb) of a second corner pixel PX2 (or second light-emitting element set PX2) arranged in the second corner display area CDA2.

The first corner pixel circuits PC1 may include a plurality of transistors, a storage capacitor, and various conductive wires. An area of the substrate 100 that accommodates one first corner pixel circuit PC1 may have a substantially rectangular shape including a long side Ls and a short side Ss. The long side Ls of that area accommodating the first corner pixel circuit PC1 may extend substantially parallel to the first direction, i.e., the lengthwise direction of the strip STP.

A second pixel circuit area PCA2 that accommodates multiple second corner pixel circuits PC2 and a corner driving circuit area SDRVAI that accommodates multiple corner driving circuits SDRV1 may be arranged in the second corner display area CDA2.

The corner driving circuit area SDRVAI may be between the first pixel circuit area PCA1 and the second pixel circuit area PCA2. The corner driving circuits SDRV1 arranged in the corner driving circuit area SDRVAI may be different from each of the first corner pixel circuits PC1 and the second corner pixel circuits PC2. The corner driving circuits SDRV1 may provide signals, such as scan signals, to the first corner pixel circuits PC1 and the second corner pixel circuits PC2.

The second corner pixel circuits PC2 may drive the subpixels SPr, SPg, and SPb of the second corner pixel PX2 arranged in the second corner display area CDA2. An area of the substrate 100 that accommodates one second corner pixel circuit PC2 may have a substantially rectangular shape including a long side Ls and a short side Ss. The long side Ls of the area accommodating the second corner pixel circuit PC2 may be substantially parallel to the second direction and may be substantially perpendicular to the first direction. The short side Ss of the area accommodating the second corner pixel circuit PC2 may be substantially parallel to the first direction. The area and/or structure of the second corner pixel circuit PC2 may be identical to or analogous to the area and/or structure of the first corner pixel circuit PC1 rotated by 90 degrees.

Because short sides Ss of the second corner pixel circuits PC2 are arranged parallel to the first direction, an area of the substrate 100 occupied by the second corner pixel circuits PC2 in the first direction may be reduced. Thus, a dead space (or underutilized area) of the display panel 10 may be reduced.

Referring to FIG. 8, the corner pixels PXc may be arranged in the corner display area CDA, and the corner pixels PXc may be spaced apart from each other at a certain distance in the first direction and the second direction. The corner pixels PXc may include first light-emitting element sets PX1, first corner pixel circuits PC1, second light-emitting element sets PX2, and second corner pixel circuits PC2. Although FIG. 8 shows that three columns of corner pixels PXc (with three columns of light-emitting element sets PX1/PX2) are arranged in the second direction in each strip STP, one or two columns of corner pixels PXc or three or more columns of corner pixels PXc may be arranged in the second direction in each strip STP.

A corner pixel PXc may include a first subpixel SPr (or first light-emitting element SPr), a second subpixel SPg (or second light-emitting element SPg), and a third subpixel SPb (or third light-emitting element SPb), which may respectively emit light of different colors, e.g., red, green, and blue colors.

In one corner pixel PXc, the third subpixel SPb may be arranged in a first row, and the first subpixel SPr and the second subpixel SPg may be arranged in a second row adjacent to the first row. The third subpixel SPb may be longer than each of the first subpixel SPr and the second subpixel SPg in the second direction. A length of the third subpixel SPb in the second direction may be greater than or equal to a sum of a length of the first subpixel SPr in the second direction and a length of the second subpixel SPg in the second direction. One side of the third subpixel SPb may be opposite each of one side of the first subpixel SPr and one side of the second subpixel SPg.

The corner pixels PXc may include the first corner pixel PX1 (or first light-emitting element set PX1) arranged in the first corner display area CDA1 and may include the second corner pixel PX2 (or second light-emitting element set PX2) arranged in the second corner display area CDA2. The first corner pixel PX1 and the second corner pixel PX2 may have the same subpixel arrangement (or same arrangement of light-emitting elements).

A first corner pixel PX1 (or first light-emitting element set PX1) may overlap the first corner pixel circuit PC1. The first corner pixel PX1 may be driven by the first corner pixel circuit PC1.

A portion of second corner pixels PX2 (or second light-emitting element sets PX2) may overlap the corner driving circuit SDRV1. The other portion of the second corner pixels PX2 (or second light-emitting element sets PX2) may overlap a second corner pixel circuit PC2. The second corner pixel PX2 overlapping the second corner pixel circuit PC2 may be driven by the second corner pixel circuit PC2. The second corner pixel PX2 overlapping the corner driving circuit SDRV1 may be driven by a first corner pixel circuit PC1 or may be driven by a second corner pixel circuit PC2.

Figure 9:
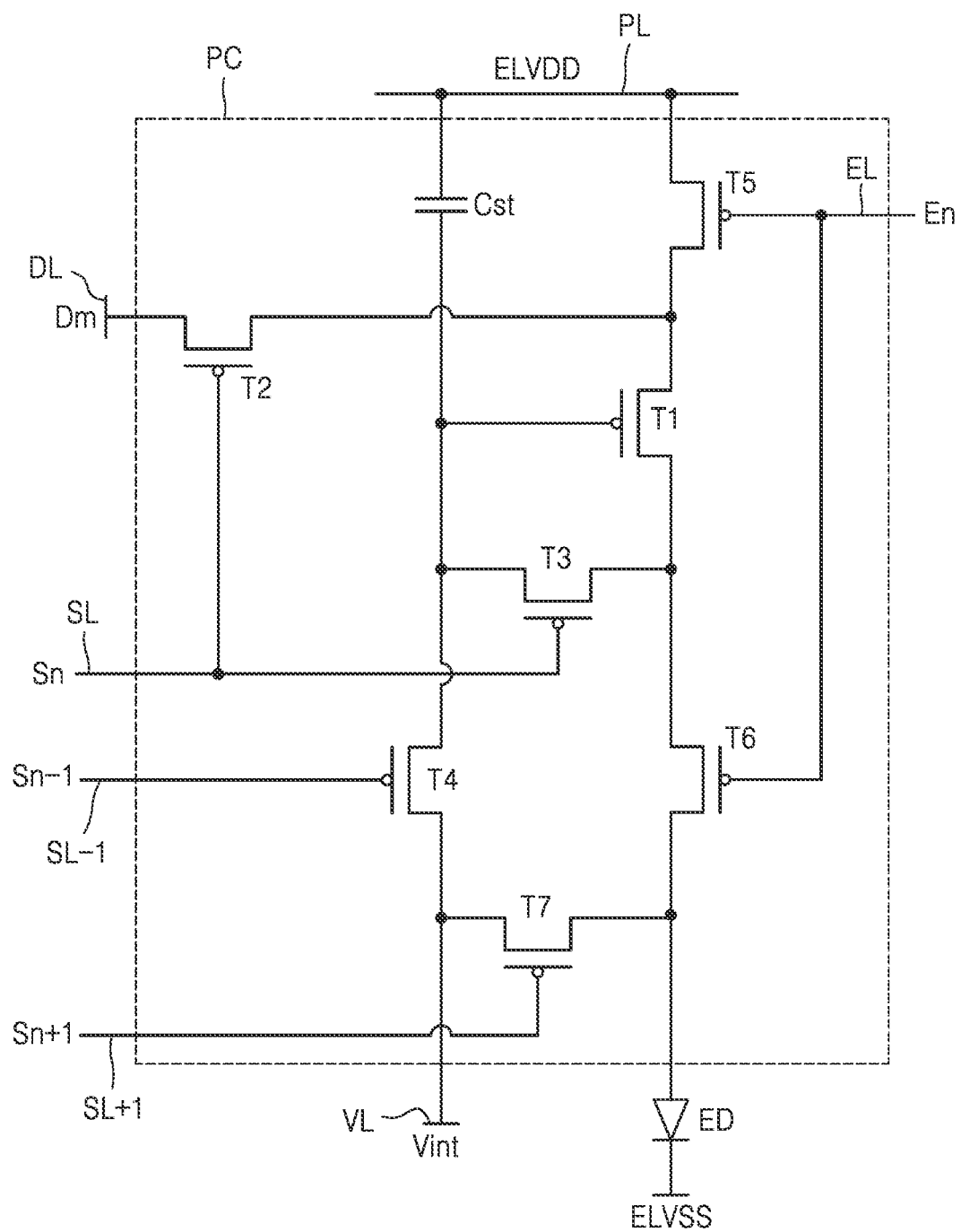
FIG. 9 is an equivalent circuit diagram of a pixel circuit applicable as a first corner pixel circuit and a second corner pixel circuit according to an embodiment.

FIG. 9 is an equivalent circuit diagram of a pixel circuit PC applicable as a first corner pixel circuit PC1 and a second corner pixel circuit PC2 according to an embodiment.

Referring to FIG. 9, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7 and a storage capacitor Cst.

FIG. 9 shows that a pixel circuit PC may be electrically connected to signal lines SL, SL−1, SL+1, EL, and DL, an initialization voltage line VL, and a driving voltage line PL. At least one of the signal lines SL, SL−1, SL+1, EL, and DL, and/or the initialization voltage line VL may be shared by multiple pixel circuits PC.

A drain electrode of the driving thin-film transistor T1 may be electrically connected to a pixel electrode of a light-emitting element ED through the emission control thin-film transistor T6. The driving thin-film transistor T1 receives a data signal Dm in response to a switching operation of the switching thin-film transistor T2 and supplies a driving current to the light-emitting element ED.

A gate electrode of the switching thin-film transistor T2 is connected to the scan line SL, and a source electrode of the switching thin-film transistor T2 is connected to the data line DL. A drain electrode of the switching thin-film transistor T2 may be connected to a source electrode of the driving thin-film transistor T1 and connected to the driving voltage line PL through the operation control thin-film transistor T5.

The switching thin-film transistor T2 is turned on in response to a scan signal Sn received through the scan line SL and performs a switching operation of transmitting the data signal Dm received through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and connected to the pixel electrode of the light-emitting element ED through the emission control thin-film transistor T6. A drain electrode of the compensation thin-film transistor T3 may be connected to one of electrodes of the storage capacitor Cst, a source electrode of the first initialization thin-film transistor T4, and the gate electrode of the driving thin-film transistor T1, simultaneously. The compensation thin-film transistor T3 may be turned on in response to the scan signal Sn transmitted through the scan line SL, and may connect the gate electrode to the drain electrode of the driving thin-film transistor T1, so as to diode-connect the driving thin-film transistor T1.

A gate electrode of the first initialization thin-film transistor T4 may be connected to the previous scan line SL−1. A drain electrode of the first initialization thin-film transistor T4 may be connected to the initialization voltage line VL. The source electrode of the first initialization thin-film transistor T4 may be connected to one of the electrodes of the storage capacitor Cst, the drain electrode of the compensation thin-film transistor T3, and the gate electrode of the driving thin-film transistor T1, simultaneously. The first initialization thin-film transistor T4 may be turned on in response to a previous scan signal Sn−1 received through the previous scan line SL−1, and may transmit an initialization voltage Vint to the gate electrode of the driving thin-film transistor T1, so as to perform an initialization operation of initializing a voltage of the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the light-emitting element ED. The operation control thin-film transistor T5 and the emission control thin-film transistor T6 are simultaneously turned on in response to an emission control signal En received through the emission control line EL, a driving voltage ELVDD is transmitted to the light-emitting element ED, and the driving current flows through the light-emitting element ED.

A gate electrode of the second initialization thin-film transistor T7 may be connected to the next scan line SL+1. A source electrode of the second initialization thin-film transistor T7 may be connected to the pixel electrode of the light-emitting element ED. A drain electrode of the second initialization thin-film transistor T7 may be connected to the initialization voltage line VL. The second initialization thin-film transistor T7 may be turned on in response to a next scan signal Sn+1 received through the next scan line SL+1 and initialize a voltage of the pixel electrode of the light-emitting element ED.

Although it is shown in FIG. 9 that the first initialization thin-film transistor T4 and the second initialization thin-film transistor T7 are connected to the previous scan line SL−1 and the next scan line SL+1, respectively, one or more embodiments are not limited thereto. The first initialization thin-film transistor T4 and the second initialization thin-film transistor T7 may be all connected to the previous scan line SL−1 and may be driven according to the previous scan signal Sn−1.

Another of the electrodes of the storage capacitor Cst may be connected to the driving voltage line PL. One of the electrodes of the storage capacitor Cst may be connected to the gate electrode of the driving thin-film transistor T1, the drain electrode of the compensation thin-film transistor T3, and the source electrode of the first initialization thin-film transistor T4.

An opposite electrode (e.g., a cathode electrode) of the light-emitting element ED receives a common voltage ELVSS. The light-emitting element ED receives the driving current from the driving thin-film transistor T1 and emits light.

Figure 10A:
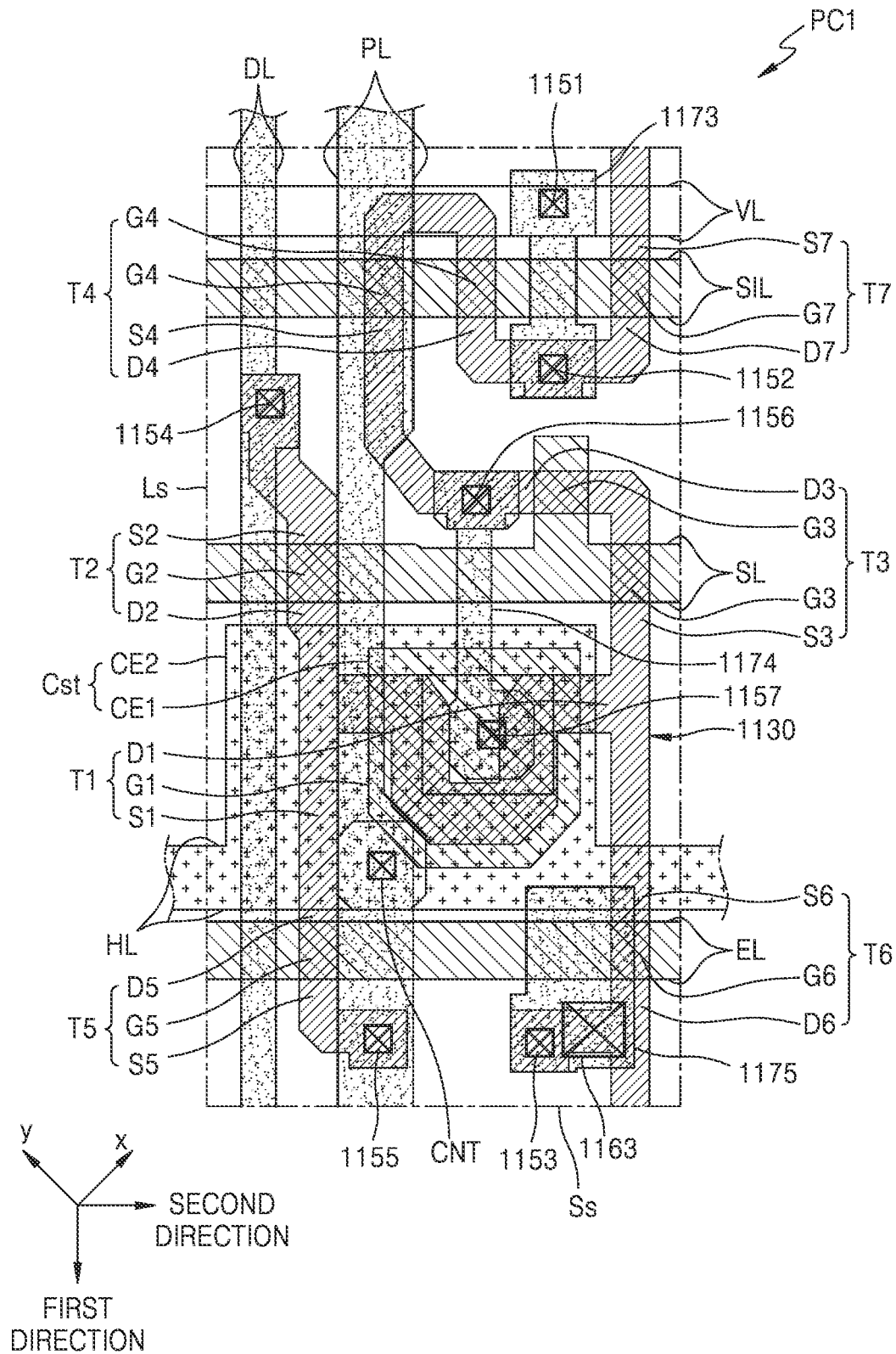
FIG. 10A is a plan layout view of a first corner pixel circuit according to an embodiment.
Figure 10B:
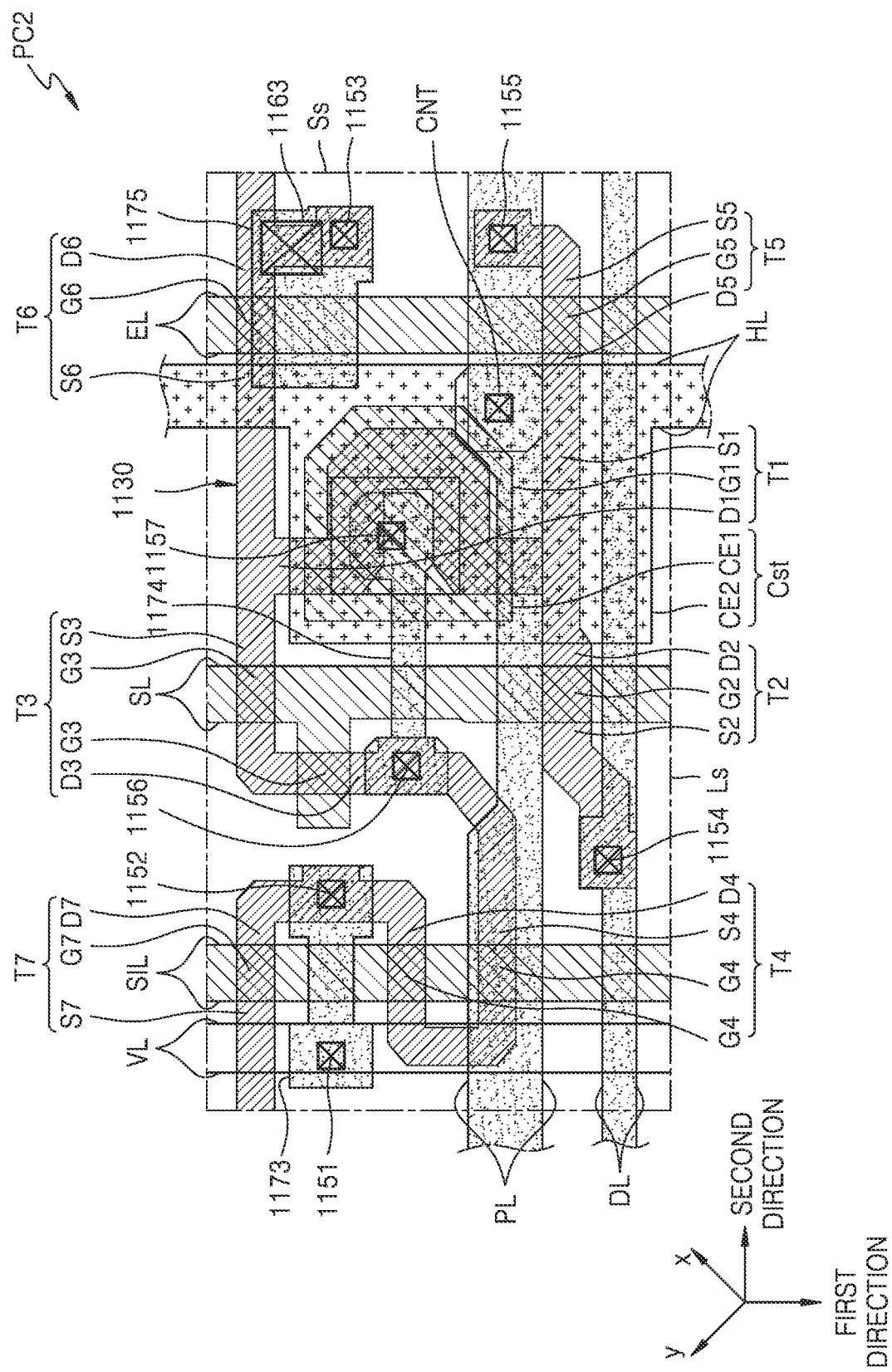
FIG. 10B is a plan layout view of a second corner pixel circuit according to an embodiment.

FIG. 10A is a plan layout view of a first corner pixel circuit PC1 according to an embodiment, and FIG. 10B is a plan layout view of a second corner pixel circuit PC2 according to an embodiment. The first corner pixel circuit PC1 and the second corner pixel circuit PC2 have substantially the same elements and structures, but the first corner pixel circuit PC1 and the second corner pixel circuit PC2 may be oriented by being rotated by 90 degrees from each other.

Referring to FIG. 10A, the driving thin-film transistor T1, the switching thin-film transistor T2, the compensation thin-film transistor T3, the first initialization thin-film transistor T4, the operation control thin-film transistor T5, the emission control thin-film transistor T6, the second initialization thin-film transistor T7, and the storage capacitor Cst are included in the first corner pixel circuit PC1 and are arranged along a semiconductor layer 1130. The semiconductor layer 1130 is disposed on a buffer layer including an inorganic insulating material and formed on a substrate.

Some portions of the semiconductor layer 1130 are semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. The semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be connected to each other and may be curved in a plan view of the first corner pixel circuit PC1.

The semiconductor layer 1130 includes a channel region, and a source region and a drain region on opposite sides of the channel region. The source region and the drain region may be respectively connected to a source electrode and a drain electrode of the corresponding thin-film transistor. For convenience of descriptions, the source region and the drain region may be referred to as the source electrode and the drain electrode.

The driving thin-film transistor T1 includes a driving gate electrode G1 overlapping a driving channel region, and a driving source electrode S1 and a driving drain electrode D1 on opposite sides of the driving channel region. The driving channel region overlapping the driving gate electrode G1 may have a bent shape, such as an omega shape, and thus may have a long channel length in a narrow space. When a length of the driving channel region is long, a driving range of a gate voltage increases, and thus, a gray scale of light emitted from the organic light-emitting diode OLED may be more precisely controlled, and display quality may be improved.

The switching thin-film transistor T2 includes a switching gate electrode G2 overlapping a switching channel region, and a switching source electrode S2 and a switching drain electrode D2 on opposite sides of the switching channel region. The switching drain electrode D2 may be connected to the driving source electrode S1. In the first corner pixel circuit PC1, the switching gate electrode G2 may be positioned between the switching source electrode S2 and the switching drain electrode D2 in the first direction and may be connected to the scan line SL. The scan line SL may extend in the second direction. The switching source electrode S2 may be electrically connected to the data line DL. The data line DL may extend in the first direction.

The compensation thin-film transistor T3 is a dual thin-film transistor and may include compensation gate electrodes G3 overlapping two compensation channel regions, and a compensation source electrode S3 and a compensation drain electrode D3, which are arranged on two sides of the two compensation channel regions. The compensation thin-film transistor T3 may be connected to the driving gate electrode G1 of the driving thin-film transistor T1 through a node connection line 1174.

The first initialization thin-film transistor T4 is a dual thin-film transistor and may include first initialization gate electrodes G4 overlapping two first initialization channel regions, and a first initialization source electrode S4 and a first initialization drain electrode D4, which are arranged on two sides of the two first initialization channel regions.

The operation control thin-film transistor T5 may include an operation control gate electrode G5 overlapping an operation control channel region, and an operation control source electrode S5 and an operation control drain electrode D5, which are positioned on opposite sides of the operation control channel region. The operation control drain electrode D5 may be connected to the driving source electrode S1.

The emission control thin-film transistor T6 may include an emission control gate electrode G6 overlapping an emission control channel region, and an emission control source electrode S6 and an emission control drain electrode D6, which are positioned on opposite sides of the emission control channel region. The emission control source electrode S6 may be connected to the driving drain electrode D1.

The second initialization thin-film transistor T7 may include a second initialization gate electrode G7 overlapping a second initialization channel region, and a second initialization source electrode S7 and a second initialization drain electrode D7, which are positioned on opposite sides of the second initialization channel region.

The thin-film transistors T1, T2, T3, T4, T5, T6, and T7 may be connected to signal lines SL, SIL, EL, and DL, the initialization voltage line VL, and the driving voltage line PL.

The scan line SL, the previous scan line SIL, the emission control line EL, and the driving gate electrode G1 may be disposed on the semiconductor layer 1130 and may be insulated from the semiconductor layer 130 by one or more intervening insulating layers.

The scan line SL may extend in the second direction. The scan line SL may include regions that are switching and compensation gate electrodes G2 and G3, respectively. For example, regions of the scan line SL overlapping the channel regions of the switching and compensation thin-film transistors T2 and T3 may be switching and compensation gate electrodes G2 and G3, respectively.

The previous scan line SIL may extend in the second direction and may include regions that are first and second initialization gate electrodes G4 and G7, respectively. For example, regions of the previous scan line SIL overlapping the channel regions of the first and second initialization thin-film transistors T4 and T7 may be first and second initialization gate electrodes G4 and G7, respectively.

The emission control line EL may extend in the second direction. The emission control line EL may include regions that are the operation control and emission control gate electrodes G5 and G6, respectively. For example, regions of the emission control line EL overlapping the channel regions of the operation control and emission control thin-film transistors T5 and T6 may be the operation control and emission control gate electrodes G5 and G6, respectively.

The driving gate electrode G1 is a floating electrode and may be connected to the compensation thin-film transistor T3 through the node connection line 1174.

An electrode voltage line HL may be disposed on and insulated from the scan line SL, previous scan line SIL, emission control line EL, and driving gate electrode CG.

The electrode voltage line HL may extend in the second direction and may cross the data line DL and the driving voltage line PL. A portion of the electrode voltage line HL may cover at least a portion of the driving gate electrode G1 and may constitute the storage capacitor Cst together with the driving gate electrode G1. For example, the driving gate electrode G1 may be a first storage capacitor electrode CE1 of the storage capacitor Cst, and a portion of the electrode voltage line HL may be a second storage capacitor electrode CE2 of the storage capacitor Cst.

The second storage capacitor electrode CE2 of the storage capacitor Cst is electrically connected to the driving voltage line PL. The electrode voltage line HL may be connected to the driving voltage line PL disposed on the electrode voltage line HL through a contact hole CNT. Accordingly, the electrode voltage line HL may have the same voltage level (constant voltage) as the driving voltage line PL. For example, the electrode voltage line HL may have a constant voltage of +5 V. The electrode voltage line HL may be a transverse driving voltage line.

Because driving voltage lines PL extend in the first direction, and because electrode voltage lines HL electrically connected to the driving voltage lines PL extends in the second direction, the driving voltage lines PL and the electrode voltage lines HL may form a mesh structure in a display area.

The electrode voltage line HL may be disposed on a different layer from the driving voltage line PL, and an electrical resistance of the electrode voltage line HL may be greater than an electrical resistance of the driving voltage line PL. The data line DL, the driving voltage line PL, an initialization connection line 1173, the node connection line 1174, and a connection metal 1175 may be disposed on and insulated from the electrode voltage line HL.

The data line DL may extend in the first direction and may be connected to the switching source electrode S2 of the switching thin-film transistor T2 through a contact hole 1154. A portion of the data line DL may be a switching source electrode S2.

The driving voltage line PL extends in the first direction and is connected to the electrode voltage line HL through the contact hole CNT. The driving voltage line PL may be connected to the operation control thin-film transistor T5 through a contact hole 1155. The driving voltage line PL may be connected to the operation control source electrode S5 through the contact hole 1155.

One end of the initialization connection line 1173 may be connected to the first and second initialization thin-film transistors T4 and T7 through a contact hole 1152, and the other end of the initialization connection line 1173 may be connected to the initialization voltage line VL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

The initialization voltage line VL may be disposed on and insulated from the data line DL, the driving voltage line PL, the initialization connection line 1173, the node connection line 1174, and the connection metal 1175.

The initialization voltage line VL may extend in the second direction. The initialization voltage line VL may be connected to the first and second initialization thin-film transistors T4 and T7 through the initialization connection line 1173. The initialization voltage line VL may have a constant voltage (e.g., −2 V).

The initialization voltage line VL may be disposed on the same layer as the electrode voltage line HL, and may include the same material as the electrode voltage line HL. In a display area, the pixel electrode of the organic light-emitting diode OLED may be connected to the emission control thin-film transistor T6. The pixel electrode may be connected to the connection metal 1175 through a contact hole 1163, and the connection metal 1175 may be connected to the emission control drain electrode D6 through a contact hole 1153.

As shown in FIG. 10A, an area occupied by the first corner pixel circuit PC1 may have a substantially rectangular shape including the long side Ls in the first direction and the short side Ss in the second direction. The long side Ls of the first corner pixel circuit PC1 may be arranged parallel to the first direction, which is a longitudinal direction of the strip STP.

The scan line SL, the previous scan line SIL, the emission control line EL, and the initialization voltage line VL are arranged in the first corner pixel circuit PC1 and may extend in the second direction. In the first corner pixel circuit PC1, the data line DL and the driving voltage line PL may extend in the first direction.

Referring to FIG. 10B, the second corner pixel circuit PC2 is substantially equivalent to the first corner pixel circuit PC1 rotated by 90 degrees in a counterclockwise direction. However, the disclosure is not limited thereto. For example, the second corner pixel circuit PC2 may be substantially equivalent to the first corner pixel circuit PC1 rotated by 90 degrees in a clockwise direction.

An area occupied by the second corner pixel circuit PC2 may have a substantially rectangular shape including the short side Ss in the first direction and the long side Ls in the second direction. Long sides Ls of the second corner pixel circuits PC2 may be arranged parallel to the second direction different from (and substantially perpendicular to) the first direction.

The scan line SL, the previous scan line SIL, the emission control line EL, and the initialization voltage line VL in the second corner pixel circuit PC2 may extend in the first direction. In the second corner pixel circuit PC2, and the data line DL and the driving voltage line PL may extend in the second direction.

Because the second corner pixel circuits PC2 are substantially equivalent to the first corner pixel circuits PC1 being rotated, a connection relationship between the second corner pixel circuits PC2 and second corner pixels PX2 (or second light-emitting element sets PX2) may be different from a connection relationship between the first corner pixel circuits PC1 and first corner pixels PX1 (or first light-emitting element sets PX1). Accordingly, driving mapping between the second corner pixel circuits PC2 and the second corner pixels PX2 may be required.

Figure 11A:
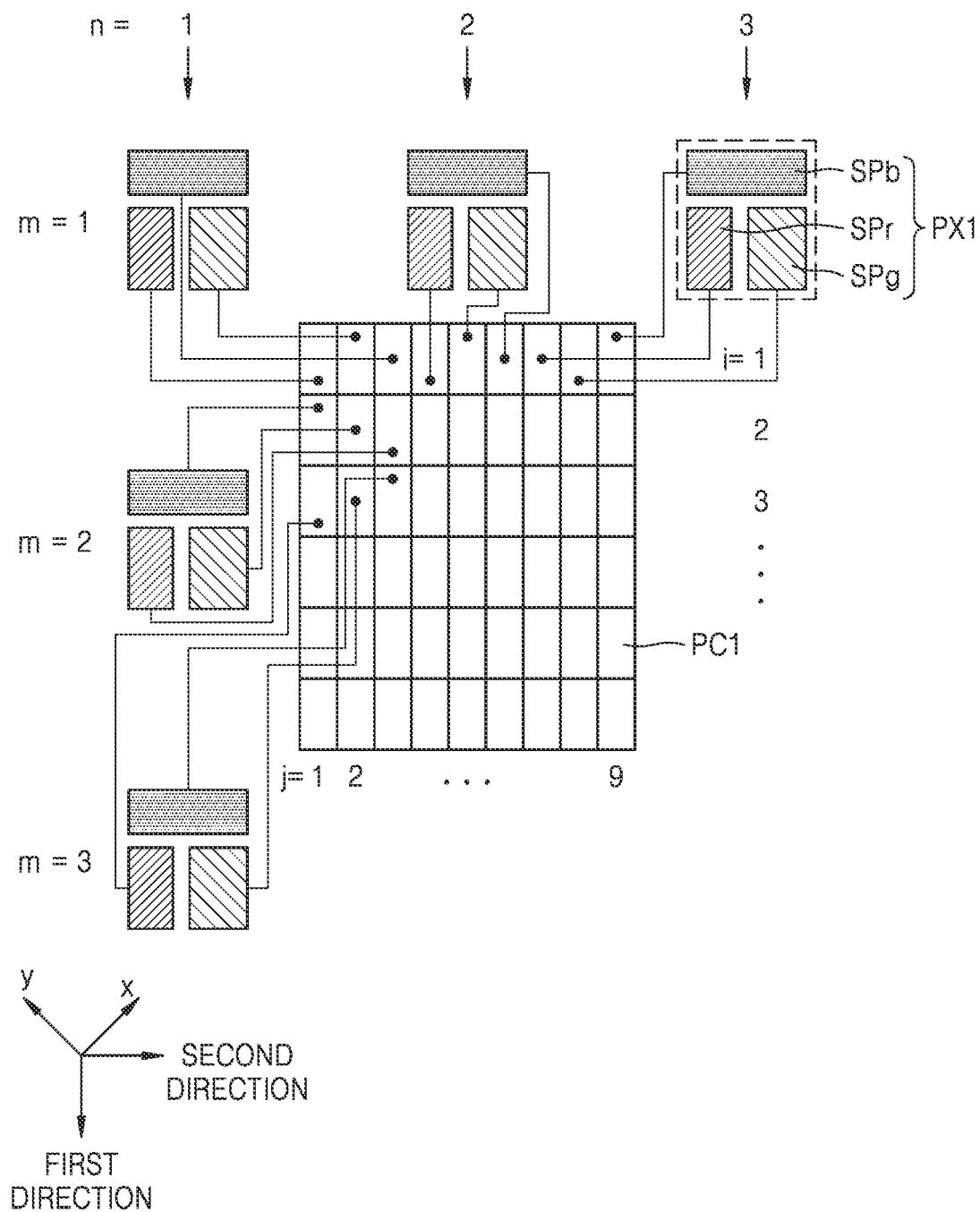
FIG. 11A illustrates a connection relationship between first corner pixel circuits and first corner pixels (or first light-emitting element sets) according to an embodiment.
Figure 11B:
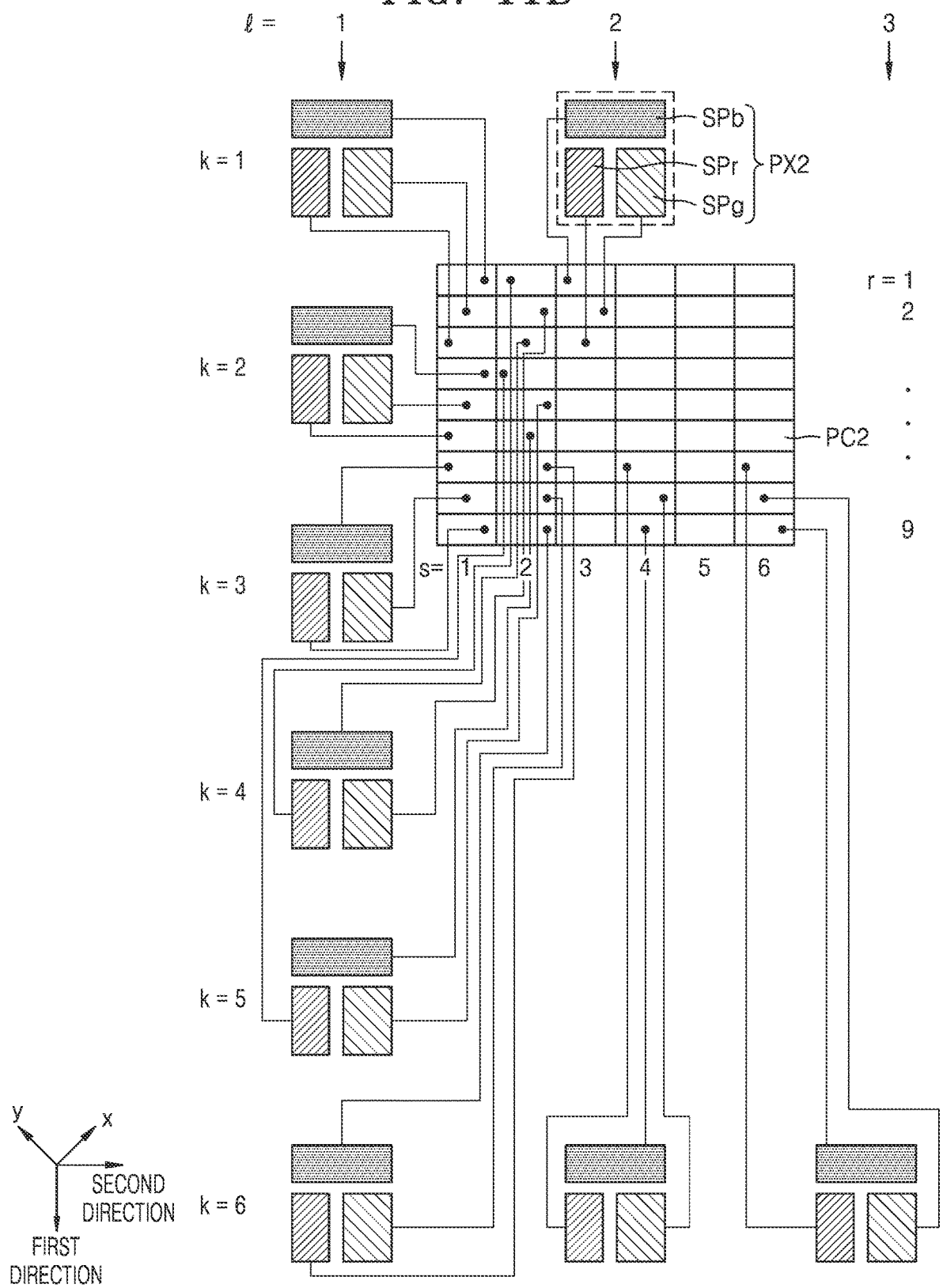
FIG. 11B illustrates a connection relationship between second corner pixel circuits and second corner pixels (or second light-emitting element sets) according to an embodiment.

FIG. 11A illustrates a connection relationship between first corner pixel circuits PC1 and first corner pixels PX1 (or first light-emitting element sets PX1) according to an embodiment. FIG. 11B illustrates a connection relationship between second corner pixel circuits PC2 and second corner pixel PX2 (or second light-emitting element sets PX2) according to embodiments. In FIGS. 11A and 11B, some of the first corner pixels PX1, some of the second corner pixels PX2, some of the first corner pixel circuits PC1, and some of the second corner pixel circuits PC2 are shown.

Referring to FIG. 11A, the first corner pixels PX1 (or first light-emitting element sets PX1) and the first corner pixel circuits PC1 may be arranged in a matrix form with the first direction as a column direction and the second direction as a row direction. The first corner pixels PX1 may be provided in an m×n matrix, and the first corner pixel circuits PC1 may be provided in an i×j matrix (where m, n, i, and j are positive integers).

Each first corner pixel PX1 may include a first subpixel SPr (or first light-emitting element SPr), a second subpixel SPg (or second light-emitting element SPg), and the third subpixel SPb (or third light-emitting element SPb), which may be a red subpixel (or red light-emitting element), a green subpixel (or green light-emitting element), and a blue subpixel (or blue light-emitting element), respectively. A first subpixel SPr, a second subpixel SPg, and a third subpixel SPb included in one first corner pixel PX1 may be respectively connected to the first corner pixel circuits PC1 aligned with each other in the second direction in a same row.

The first corner pixels PX1 may be arranged in three columns (n=3), and the first corner pixel circuits PC1 may be arranged in nine columns (j=9). The number of rows of the first corner pixels PX1 and the number of rows of the first corner pixel circuits PC1 may depend on an area of the first corner display area CDA1.

Subpixels SPr, SPg, and SPb of a first corner pixel PX1 arranged in a first row and a first column, with (m, n)=(1, 1), may be respectively connected to first corner pixel circuits PC1 arranged in first to third columns in the first row, with (i, j)=(1, 1), (1, 2), and (1, 3).

Subpixels SPr, SPg, and SPb of a first corner pixel PX1 arranged with (m, n)=(1, 2) may be respectively connected to first corner pixel circuits PC1 arranged with (i, j)=(1, 4), (1, 5), and (1, 6).

Light-emitting elements of first corner pixels PX1 arranged in a row of m=1 may be respectively connected to first corner pixel circuits PC1 arranged in a row of i=1. Similarly, light-emitting elements of first corner pixels PX1 arranged in a row of m=2 may be respectively connected to first corner pixel circuits PC1 arranged in a row of i=2.

As a row number of the light-emitting elements of the first corner pixels PX1 increases, a row number of the corresponding first corner pixel circuits PC1 also increases. Light-emitting elements of the first corner pixels PX1 arranged in the same row may be all connected to the first corner pixel circuits PC1 arranged in the same row.

Referring to FIG. 11B, the second corner pixels PX2 (or second light-emitting element sets PX2) and the second corner pixel circuits PC2 may be arranged in a matrix form with the first direction as a column direction and the second direction as a row direction. The second corner pixels PX2 may be provided in a k×l matrix, and the second corner pixel circuits PC2 may be provided in an r×s matrix (where k, l, r, and s are positive integers).

Each second corner pixel PX2 may include a first subpixel SPr (or first light-emitting element SPr), a second subpixel SPg (or second light-emitting element SPg), and the third subpixel SPb (or third light-emitting element SPb), which may be a red subpixel (or red light-emitting element), a green subpixel (or green light-emitting element), and a blue subpixel (or blue light-emitting element), respectively. A first subpixel SPr, a second subpixel SPg, and a third subpixel SPb included in one second corner pixel PX2 may be respectively connected to the second corner pixel circuits PC2 aligned with each other in the first direction in a same column.

The second corner pixels PX2 may be arranged in a 6×3 matrix, and the second corner pixel circuits PC2 may be arranged in a 9×6 matrix.

Subpixels SPr, SPg, and SPb of a second corner pixel PX2 arranged with (k, l)=(1, 1) may be respectively connected to second corner pixel circuits PC2 arranged with (r, s)=(1, 1), (2, 1), and (3, 1).

Subpixels SPr, SPg, and SPb of a second corner pixel PX2 arranged with (k, l)=(4, 1) may be respectively connected to second corner pixel circuits PC2 arranged with (r, s)=(1, 2), (2, 2), and (3, 2).

Subpixels SPr, SPg, and SPb of a second corner pixel PX2 arranged with (k, l)=(1, 2) may be respectively connected to second corner pixel circuits PC2 arranged with (r, s)=(1, 3), (2, 3), and (3, 3).

Some of the second corner pixels PX2 arranged in a column of l=1 may be respectively connected to second corner pixel circuits PC2 arranged in a column of s=1, and others of the second corner pixels PX2 arranged in a column of l=1 may be respectively connected to second corner pixel circuits PC2 arranged in a column of s=2.

As a row number of the light-emitting elements of the second corner pixels PX2 increases, a row number of the corresponding second corner pixel circuits PC2 may not increase. Light-emitting elements of some of the second corner pixels PX2 arranged in the same column may be connected to second corner pixel circuits PC2 arranged in different columns. The connection structure may effectively minimize interference between wires.

As can be appreciated from the disclosure, display panels and display apparatuses according to embodiments may include corner display areas. Advantageously, display areas (in which images are displayed in response to input signals) may be desirably maximized.

According to embodiments, under-utilized dead space may be advantageously minimized because an arrangement of pixel circuits arranged in corner display areas is optimized.

The described embodiments should be considered in an illustrative sense and not for purposes of limitation. Descriptions of features or aspects within each embodiment should typically be considered as available for other similar features or aspects in other embodiments. While embodiments have been described with reference to the figures, various changes in form and details may be made in the described embodiments without departing from the scope defined by the claims.

What is claimed is:

1. A display panel comprising:
   main pixels including a main pixel;
   a third scan line electrically connected to the main pixel and extending lengthwise in a third direction;
   first corner pixels arranged at a corner of the display panel and including a first corner pixel;
   a first scan line electrically connected to the first corner pixel and extending lengthwise in a second direction, wherein the first corner pixel comprises a first switching transistor, wherein the first switching transistor comprises a first source electrode, a first drain electrode, and a first gate electrode, wherein the first gate electrode is positioned between the first source electrode and the first drain electrode in a first direction and is electrically connected to the first scan line;
   second corner pixels arranged between the first corner pixels and the main pixels and including a second corner pixel; and
   a second scan line electrically connected to the second corner pixel and extending lengthwise in the first direction,
   wherein the first direction, the second direction, and the third direction are different from each other.

2. The display panel of claim 1, wherein the second corner pixel comprises a second switching transistor, wherein the second switching transistor comprises a second source electrode, a second drain electrode, and a second gate electrode, and wherein the second gate electrode is positioned between the second source electrode and the second drain electrode in the second direction and is electrically connected to the second scan line.

3. The display panel of claim 1, wherein the first corner pixels comprise first light-emitting element sets and first corner pixel circuits, and wherein light-emitting elements of some of the first light-emitting element sets that are aligned in the second direction are all electrically connected to some of the first corner pixel circuits that are arranged in a same row.

4. The display panel of claim 1, wherein the second corner pixels comprise second light-emitting element sets and second corner pixel circuits, and wherein some of the second light-emitting element sets are arranged in a same column and are electrically connected to some of the second corner pixel circuits arranged in different columns.

5. The display panel of claim 1, wherein the first corner pixels comprise first light-emitting element sets and first corner pixel circuits, and wherein the first corner pixel includes a red light-emitting element, a green light-emitting element, and a blue light-emitting element that are respectively electrically connected to three of the first corner pixel circuits that are arranged in the second direction.

6. The display panel of claim 1, wherein the second corner pixels comprise second light-emitting element sets and second corner pixel circuits, and wherein the second corner pixel includes a red light-emitting element, a green light-emitting element, and a blue light-emitting element that are respectively electrically connected to three of the second corner pixel circuits that are arranged in the first direction.

7. The display panel of claim 1, wherein the third direction is oblique relative to each of the second direction and the first direction.

8. The display panel of claim 1, comprising: a corner driving circuit configured to provide scan signals, wherein at least some light-emitting elements of the first corner pixels or at least some light-emitting elements of the second corner pixels overlap the corner driving circuit.

9. The display panel of claim 1, comprising: a substrate comprising a main area and a strip, wherein the strip protrudes relative to the main area, wherein the main pixels are positioned in the main area, and wherein some of the first corner pixels are positioned in the strip and are arranged in at least three columns between two opposite edges of the strip in a plan view of the display panel.

10. The display panel of claim 1, wherein the first corner pixel includes a red light-emitting element, a green light-emitting element, and a blue light-emitting element, and wherein one side of the blue light-emitting element is opposite each of one side of the red light-emitting element and one side of the green light-emitting element.

11. A display apparatus comprising:
main pixels including a main pixel;
a third data line electrically connected to the main pixel and extending lengthwise in a third direction;
first corner pixels arranged at a corner of the display apparatus and including a first corner pixel;
a first data line electrically connected to the first corner pixel and extending lengthwise in a first direction, wherein the first corner pixel comprises a first switching transistor, wherein the first switching transistor comprises a first source electrode, a first drain electrode, and a first gate electrode, wherein the first gate electrode is positioned between the first source electrode and the first drain electrode in the first direction, wherein the first source electrode is electrically connected to the first data line;
second corner pixels arranged between the first corner pixels and the main pixels and including a second corner pixel; and
a second data line electrically connected to the second corner pixel and extending lengthwise in a second direction,
wherein the first direction, the second direction, and the third direction are different from each other.

12. The display apparatus of claim 11, wherein the second corner pixel comprises a second switching transistor, wherein the second switching transistor comprises a second source electrode, a second drain electrode, and a second gate electrode, wherein the second gate electrode is positioned between the second source electrode and the second drain electrode in the second direction, and wherein the second source electrode is electrically connected to the second data line.

13. The display apparatus of claim 11, wherein the first corner pixels comprise first light-emitting element sets and first corner pixel circuits, and wherein light-emitting elements of some of the first light-emitting element sets that are aligned in the second direction are all electrically connected to some of the first corner pixel circuits that are arranged in a same row.

14. The display apparatus of claim 11, wherein the second corner pixels comprise second light-emitting element sets and second corner pixel circuits, and wherein some of the second light-emitting element sets are arranged in a same column and are electrically connected to some of the second corner pixel circuits that are arranged in different columns.

15. The display apparatus of claim 11, wherein the first corner pixels comprise first light-emitting element sets and first corner pixel circuits, and wherein the first corner pixel includes a red light-emitting element, a green light-emitting element, and a blue light-emitting element that are respectively electrically connected to three of the first corner pixel circuits that are arranged in the second direction.

16. The display apparatus of claim 11, wherein the second corner pixels comprise second light-emitting element sets and second corner pixel circuits, and wherein the second corner pixel includes a red light-emitting element, a green light-emitting element, and a blue light-emitting element that are respectively electrically connected to three of the second corner pixel circuits that are arranged in the first direction.

17. The display apparatus of claim 11, wherein the third direction is oblique relative to each of the first direction and the second direction.

18. The display apparatus of claim 11, comprising: a corner driving circuit configured to provide scan signals, wherein at least some light-emitting elements of the first corner pixels or at least some light-emitting elements of the second corner pixels overlap the corner driving circuit.

19. The display apparatus of claim 11, comprising: a substrate comprising a main area and a strip, wherein the strip protrudes relative to the main area, wherein the main pixels are positioned in the main area, and wherein some of the first corner pixels are positioned in the strip and are arranged in at least three columns between two opposite edges of the strip in a plan view of the display apparatus.

20. The display apparatus of claim 11, wherein the first corner pixel includes a red light-emitting element, a green light-emitting element, and a blue light-emitting element, and wherein one side of the blue light-emitting element is opposite each of one side of the red light-emitting element and one side of the green light-emitting element.

\* \* \* \* \*